US012001145B2

(12) United States Patent
Freytag et al.

(10) Patent No.: US 12,001,145 B2
(45) Date of Patent: Jun. 4, 2024

(54) APPARATUS AND METHOD FOR ANALYZING AN ELEMENT OF A PHOTOLITHOGRAPHY PROCESS WITH THE AID OF A TRANSFORMATION MODEL

(71) Applicant: Carl Zeiss SMT GmbH, Oberkochen (DE)

(72) Inventors: Alexander Freytag, Erfurt (DE); Christoph Husemann, Jena (DE); Dirk Seidel, Jena-Leutra (DE); Carsten Schmidt, Jena (DE); Thomas Scheruebl, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 445 days.

(21) Appl. No.: 16/415,510

(22) Filed: May 17, 2019

(65) Prior Publication Data

US 2019/0354019 A1    Nov. 21, 2019

(30) Foreign Application Priority Data

May 18, 2018    (DE) .......................... 102018207882.3

(51) Int. Cl.
*G03F 7/00*    (2006.01)
*G06N 20/00*    (2019.01)

(52) U.S. Cl.
CPC .............. *G03F 7/705* (2013.01); *G06N 20/00* (2019.01)

(58) Field of Classification Search
CPC ................................ G03F 7/705; G06N 20/00
See application file for complete search history.

(56) References Cited

U.S. PATENT DOCUMENTS

| 6,884,999 B1 * | 4/2005 | Yedur ................. H01L 22/20 250/307 |
| 7,079,235 B2 | 7/2006 | Lehman |
| 7,727,681 B2 * | 6/2010 | Stewart ................. G03F 1/74 430/5 |

(Continued)

FOREIGN PATENT DOCUMENTS

| CN | 103703415 | 4/2014 |
| CN | 104995562 | 10/2015 |

(Continued)

OTHER PUBLICATIONS

The Notice of Allowance form the Korean Intellectual Property Office for Korean Application No. 10-2019-0058103 by dated Mar. 30, 2021 (with English Translation).

(Continued)

*Primary Examiner* — Mohamed Charioui
*Assistant Examiner* — Lynda Dinh
(74) *Attorney, Agent, or Firm* — Fish & Richardson P.C.

(57) ABSTRACT

An apparatus for analyzing an element of a photolithography process, said apparatus comprising: (a) a first measuring apparatus for recording first data of the element; and (b) means for transforming the first data into second, non-measured data, which correspond to measurement data of a measurement of the element with a second measuring apparatus; (c) wherein the means comprise a transformation model, which has been trained using a multiplicity of first data used for training purposes and second data corresponding therewith, which are linked to the second measuring apparatus.

22 Claims, 12 Drawing Sheets

(56) References Cited

U.S. PATENT DOCUMENTS

| | | | |
|---|---|---|---|
| 8,460,842 B2* | 6/2013 | Ogawa | B82Y 10/00 430/5 |
| 8,674,329 B2* | 3/2014 | Budach | G03F 7/7065 250/504 R |
| 2009/0063378 A1* | 3/2009 | Izikson | G03F 7/70633 706/21 |
| 2010/0005041 A1 | 1/2010 | Wang | |
| 2014/0165236 A1* | 6/2014 | Budach | G01Q 30/02 850/9 |
| 2014/0172394 A1 | 6/2014 | Kuznetsov et al. | |
| 2014/0297211 A1 | 10/2014 | Pandev et al. | |
| 2016/0148850 A1 | 5/2016 | David | |
| 2017/0140524 A1 | 5/2017 | Karsenti et al. | |
| 2017/0176851 A1 | 6/2017 | Peters et al. | |
| 2017/0261863 A1 | 9/2017 | Downes et al. | |
| 2017/0357159 A1 | 12/2017 | Kant et al. | |
| 2018/0017501 A1 | 1/2018 | Trenholm et al. | |
| 2018/0089817 A1 | 3/2018 | Blumrich | |
| 2018/0106831 A1 | 4/2018 | Budach et al. | |
| 2018/0341173 A1* | 11/2018 | Li | G03F 1/36 |
| 2019/0094713 A1 | 3/2019 | Queens et al. | |

FOREIGN PATENT DOCUMENTS

| | | |
|---|---|---|
| CN | 107506774 | 12/2017 |
| DE | 102014217907 | 3/2016 |
| DE | 102016218452 | 3/2018 |
| JP | 2017-536584 | 12/2017 |
| JP | 2017-538156 | 12/2017 |
| KR | 1020140056279 | 5/2014 |
| KR | 1020150136524 | 12/2015 |
| TW | 201728897 | 8/2017 |
| TW | 201740216 | 11/2017 |
| WO | WO 2017/087653 | 5/2017 |
| WO | WO 2017/117568 | 7/2017 |
| WO | WO 2017/117573 | 7/2017 |
| WO | WO 2017/120253 | 7/2017 |
| WO | WO 2017/123555 | 7/2017 |
| WO | WO 2017/123561 | 7/2017 |
| WO | WO 2017/205537 | 11/2017 |

OTHER PUBLICATIONS

The First Office Action and Search Report issued by the Chinese Patent Office for Application No. CN 201910421175.2, dated Apr. 9, 2021 (with English Translation).

The Taiwan Search Report for Taiwan Application No. TW 108117117 dated Apr. 21, 2020 (with English Translation).

Huang et al., "Densely Connected Convolutional Networks," "https://arxiv.org/pdf/1608.06993.pdf" (Jan. 28, 2018).

Krizhevsky et al., "ImageNet Classification with Deep Convolutional Neural Networks," *Neural Information Processing Systems*, "https://papers.nips.cc/paper/4824-imagenet-classification-with-deep-convolutional-neural-networks.pdf" (2012).

Simonyan et al., "Very Deep Convolutional Networks for Large-Scale Image Recognition," *Published as a conference paper at ICLR 2015*, "https://arxiv.org/pdf/1409.1556.pdf" (Apr. 10, 2015).

He et al., "Deep Residual Learning for Image Recognition", *IEEE Conf. on Computer Vision and Pattern Recognition (CVPR)*, Jun. 26-Jul. 1, 2016, Las Vegas, Nevada, USA, pp. 770-778.

Jégou et al., "The One Hundred Layers Tiramisu: Fully Convolutional DefenseNets for Semantic Segmentation", *Computer Vision and Pattern Recognition*, Dec. 5, 2016, arXiv: 1611.09326.

Lin et al., "RefineNet: Muli-Path Refinement Networks for High-Resolution Semantic Segmentation", *IEEE Cent. on Computer Vision and Pattern Recognition (CVPR)*, Jun. 26-Jul. 1, 2016, Las Vegas, Nevada, USA, arXiv preprint arXiv: 1611.09326.

Ronneberger et al., "U-Net: Convolutional Networks for Biomedical Image Segmentation", *18th Intern. Conf. on Medical Image Computing and Computer-Assisted Intervention (MICCAI)*, Oct. 5-9, 2015, in Munich.

\* cited by examiner

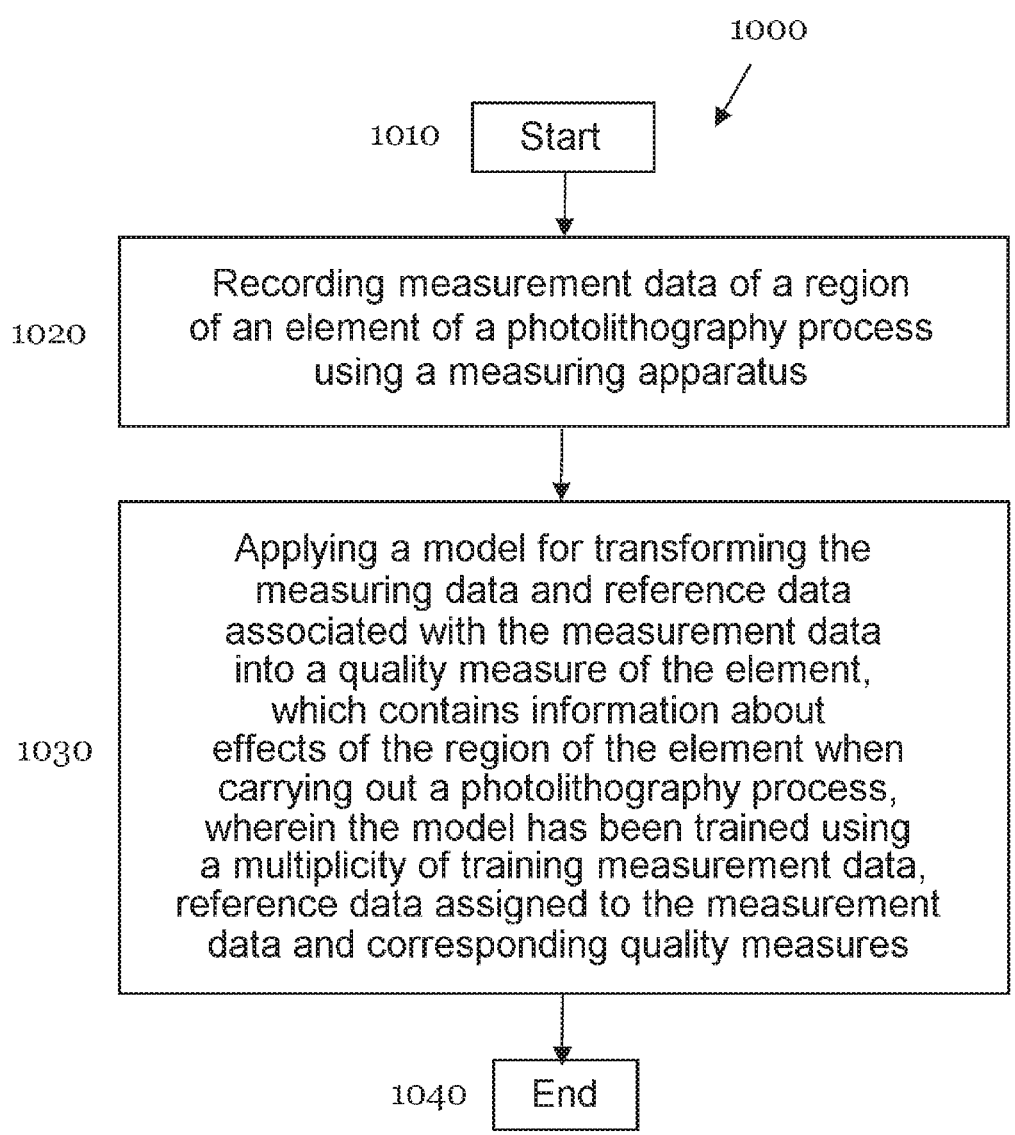

APPARATUS AND METHOD FOR ANALYZING AN ELEMENT OF A PHOTOLITHOGRAPHY PROCESS WITH THE AID OF A TRANSFORMATION MODEL

CROSS REFERENCE TO RELATED APPLICATIONS

This patent application claims priority to and benefit of the German patent application DE 10 2018 207 882.3, filed with the German Patent and Trademark Office on May 18, 2018, the entire content of which is incorporated herein by reference.

TECHNICAL FIELD

The present invention relates to an apparatus and a method for analyzing an element of the photolithography process. In particular, the present invention relates to an apparatus and a method for transforming first data of the element of the photo-lithography process, recorded with a first measuring apparatus, into second, non-measured data, which correspond to measurement data of an examination of the element with a second measuring apparatus, with a trained transformation model. Further, the present invention relates to an apparatus and a method for checking a region of an element of a photolithography process. In more detail, the present invention relates to an apparatus and a method for transforming measurement data of a region of an element of a photolithography process, recorded with a measuring apparatus, and reference data associated with the measurement data into a quality measure of the element using a trained model.

BACKGROUND

As a consequence of the growing integration density in the semiconductor industry, photolithography masks have to image increasingly smaller structures on wafers. In terms of photolithography, the trend towards growing integration density is addressed by shifting the exposure wavelength of photolithography systems to ever shorter wavelengths. Currently frequently used as a light source in photolithography systems is an ArF (argon fluoride) excimer laser that emits at a wavelength of approximately 193 nm.

Lithography systems are being developed today that use electromagnetic radiation in the EUV (extreme ultraviolet) wavelength range (for example, in the range of 10 nm to 15 nm). Said EUV lithography systems are based on a completely new beam guiding concept which uses reflective optical elements without exception, since no materials are currently available that are optically transparent in the stated EUV range. The technological challenges in developing EUV systems are enormous, and tremendous development efforts are necessary to bring said systems to a level where they are ready for industrial application.

A significant contribution to the imaging of ever smaller structures in the photoresist arranged on a wafer is due to photolithographic masks, exposure masks, photomasks or just masks. With every further increase in integration density, it becomes increasingly more important to reduce the minimum structure size of the exposure masks. The production process of photolithographic masks therefore becomes increasingly more complex and as a result more time-consuming and ultimately also more expensive. Due to the minute structure sizes of the pattern elements, defects during mask production cannot be ruled out. These must be repaired—whenever possible. The repair of mask defects is frequently implemented on the basis of a modified scanning electron microscope, for instance a MeRiT® tool.

After a defect of a photomask has been repaired, the repaired region of the photolithographic mask has to be measured in order to be able to assess whether the repair process was successful or whether it failed. By way of example, an AIMS™ (Aerial Image Metrology System) is currently used for recording one or more images of a defective and/or a repaired region. One or more aerial images of the defective and/or, in particular, of the repaired region of a mask are recorded by use of the AIMS™. The defect-afflicted and/or the repaired region of the mask are analyzed on the basis of the aerial image or images in order to be able to make a decision as to how to proceed with the mask.

A disadvantage of the sketched-out process is that there has to be a change from the repair tool (e.g., a MeRiT® tool) to an analysis tool (e.g., an AIMS™ tool) for the purposes of evaluating the quality of the repair process. The transfer of a mask from one tool to another is connected with a great time outlay, caused for example by breaking the vacuum and aligning the photomask on the AIMS™. Moreover, there is a risk of damaging the photomask during the transport and/or producing new defects.

In a new approach, attempts are currently made to approach numerous challenges in the quality assessment of photomasks with the aid of a machine learning (ML) model. The following documents are specified in an exemplary manner for this procedure: WO 2017/087 653 A1, WO 2017/117 568 A1, WO 2017/120 253 A1, WO 2017/123 555 A1, WO 2017/123 561 A1, WO 2017/117 573 A1, WO 2017/123 555 A1 and WO 2017/205 537 A1. Specific aspects of machine learning are described, for example, in the following documents: papers.nips.cc/paper/4824-imagenet-classification-with-deep-convolutional-neural-networks.pdf; and arxiv.org/pdf/1409.1556.pdf; arxiv.org/pdf/1608.06993.pdf.

As explained above, producing an aerial image for an element of a photolithography process, for instance a photolithographic mask, may be a complicated process.

The present invention is therefore directed to specifying apparatuses and methods that at least partly avoid the above-described disadvantages when evaluating the quality of an element of a photolithography process.

SUMMARY

According to a first aspect of the present invention, this problem is solved by an apparatus for analyzing an element of a photolithography process, the apparatus may comprise: (a) a first measuring apparatus for recording first data of the element; and (b) means for transforming the first data into second, non-measured data, which correspond to measurement data of a measurement of the element with a second measuring apparatus; (c) wherein the means comprise a transformation model, which has been trained using a multiplicity of first data used for training purposes and second data corresponding therewith, which are linked to the second measuring apparatus.

In a first aspect, an apparatus according to the invention solves the problem with the aid of a trained transformation model. By applying a trained transformation model, an apparatus according to the invention can transform measurement data of a first measuring apparatus, for example of a particle scanning microscope, in particular of a scanning electron microscope, in such a way that these measurement data look as if they had been measured by a second measuring apparatus, for example an optical measuring apparatus, for instance an AIMS™. Hence, an apparatus according to the invention facilitates the assessment of the quality of an element of a photolithography process, for example of a repaired defect of a photolithographic mask, on the basis of one or more measurements that are carried out by a repair tool. Here, the photomask is evaluated on the basis of a data record that resembles the image that the photomask will produce on a wafer during exposure with the actinic wavelength. Breaking the vacuum of the repair tool and the transportation to an optical measuring apparatus and aligning the element in the optical measuring apparatus and recording an image with the optical measuring apparatus can be avoided.

In a second aspect, an apparatus according to the invention solves the problem by an apparatus for transforming first data of an element of a photolithography process recorded with a first measuring apparatus into second, non-measured data, which correspond to measurement data of a measurement of the element with a second measuring apparatus, may comprise a transformation model, which has been trained using a multiplicity of first data used for training purposes and second data corresponding therewith, which are linked to the second measuring apparatus.

An apparatus according to the invention avoids the complicated production of an aerial image for being able to assess the quality of an element of a photolithography process. It is sufficient to initially carry out a complicated training process of the transformation model for a specific mask type and a certain first measuring apparatus, for example a scanning particle microscope. By way of example, the training process can be carried out at a central location, which is optimally equipped for this object. The trained transformation models for various mask types can then be provided together, for example, with a repair tool in a manufacturing environment. By applying the trained transformation model to first data of a first measuring apparatus, the first data can then be transformed into second data, either directly or after minimal fitting, said second data looking as if they had been measured by a second measuring apparatus.

The transformation model may comprise one or more hyperparameters. A hyperparameter of the transformation model may comprise at least one element from the group: a mask type, an exposure wavelength, a numerical aperture (NA) of a scanner, an exposure setting of the scanner.

The hyperparameter or hyperparameters are provided for the transformation model during the training phase and for operation. By virtue of a transformation model comprising one or more hyperparameters, it is possible to create and train a transformation model that covers a broad spectrum of applications. If necessary, a trained transformation model having one or more hyperparameters can be post-trained for a specific application.

The second data that are linked to the second measuring apparatus can comprise data measured by the second measuring apparatus and/or can comprise corresponding simulation data instead of second data measured by the second measuring apparatus.

The first measuring apparatus may comprise an imaging measuring apparatus and/or the second measuring apparatus may comprise an imaging measuring apparatus. The first imaging measuring apparatus may comprise an optical tool that operates in the ultraviolet and/or deep ultraviolet wavelength range and the second imaging measuring apparatus may comprise an optical tool that operates in the extreme ultraviolet (EUV) wavelength range. The deep ultraviolet wavelength range may comprise a wavelength of 193 nm. The first imaging measuring apparatus may comprise an AIMS™, a WLCD, and/or a PROVE® tool. The second imaging measuring apparatus may comprise an AIMS™ EUV.

Imaging measuring apparatuses are expedient as these supply measurement data in the form of images. However, imaging measuring apparatuses are no precondition for the application of a trained transformation model. Instead, the transformation model can be learnt on the basis of a sufficiently large training data record, and so it transforms first data into second, non-measured data of a second measuring apparatus.

The first measuring apparatus may comprise at least one element from the group: a scanning particle microscope, a scanning probe microscope and an interferometer, and/or the second measuring apparatus may comprise at least one element from the group: a scanning particle microscope, and/or an optical measuring tool. The optical measuring tool may, for example, comprise an AIMS™ tool, a WLCD tool and/or a PROVE® tool.

It is possible for the first measuring apparatus to comprise a scanning particle microscope and a scanning probe microscope, for example. As a result, it is possible to produce a three-dimensional representation of an element of a photolithography process.

The scanning particle microscope may comprise: a scanning electron microscope, a scanning ion beam microscope, a scanning atomic beam microscope, a scanning molecular beam microscope and/or an x-ray beam microscope. The x-ray beam microscope may comprise a scanning transmission x-ray beam microscope.

The scanning probe microscope may comprise: a scanning tunneling microscope, a scanning force microscope, a magnetic force microscope and/or an optical near-field microscope.

It is also possible for the first measuring apparatus to comprise an optical tool, i.e., an AIMS™ tool, a WLCD tool and/or a PROVE® tool, and for the second measuring apparatus to comprise a scanning particle microscope and/or a scanning probe microscope.

The first data may comprise: (a) measurement data of a region of the element of the photolithography process, which has at least one defect; and/or (b) measurement data of a repaired region of the element of the photolithography process.

An apparatus according to the invention can also be used to repair one or more defects of an element in addition to examining an element of a photolithography process. Moreover, an apparatus according to the invention can be used to scan the region of a repaired defect after a repair. Then, the quality of the defect repair can be assessed on the basis of these measurement data after applying a trained transformation model, i.e., after transforming the first measurement data into measurement data that correspond to an examination of the repaired region with a second measuring apparatus.

The second data may comprise an image with a two-dimensional pixel representation.

Image data are particularly well suited to being able to analyze the quality of a defect repair, for example. Moreover, an apparatus according to the invention which generates second data in the form of image data fits in the established work process, which checks the quality of an element of a photolithography process on the basis of image data.

The second data may comprise an aerial image and/or an aerial image focus stack.

An AIMS™ has been established as a powerful tool for analyzing defects of elements of a photolithography process. By virtue of the first data of a first measuring apparatus being transformed into an aerial image by applying a trained transformation model, it is possible to keep the established workflow for assessing the quality of an element of a photolithography process. However, it is possible to dispense with the complicated measurement of an aerial image in a manufacturing environment.

If very high requirements are placed on the quality analysis of an element for a photolithography process, the check of the element can be carried out not on the basis of an individual aerial image but on the basis of an aerial image focus stack. A transformation model can be taught to produce an aerial image focus stack for a region of the element from a corresponding set of first data of the first measuring apparatus.

The first data and the second data may have the same number of pixels. For a reproducible transformation of the first data into second data, it is necessary for a 1:1 correspondence to be present between the data of the first measuring apparatus and the second data of the second measuring apparatus. However, this does not mean that the first and the second data must have a 1:1 pixel correspondence. The number of pixels of the first and the second data may differ. Further, the first and the second data may have a systematic relative displacement in relation to one another, for example, which can be learnt by a transformation model.

The first data may comprise measurement data that were recorded with different parameter settings of the first measuring apparatus.

The different parameter settings of the first measuring apparatus may comprise at least one element from the group: focus setting, settings of a focus stack, an exposure setting and a detector setting of the first measuring apparatus.

The element of the photolithography process may comprise at least one element from the group: a photolithographic mask, a template for nano-imprint technology and a wafer.

An apparatus according to the invention is not restricted to analyzing and repairing defects of a photolithographic mask. Rather, it can be used to analyze and repair templates from the field of nano-imprint technology and wafers in various stages of the processing thereof.

In a further aspect, a method according to the invention solves the aforementioned problem by a method for analyzing an element of a photolithography process, the method may include the following steps: (a) recording first data of the element with a first measuring apparatus; and (b) transforming the first data into second, non-measured data, which correspond to measurement data of an examination of the element with a second measuring apparatus, wherein the method comprises a transformation model, which has been trained using a multiplicity of training first data and second data corresponding therewith, which are linked to the second measuring apparatus. The method may be performed by one of the apparatuses disclosed above, for example.

Transforming the first data may comprise: transforming the measurement data, which were recorded with different parameter settings of the first measuring apparatus, into an aerial image focus stack.

The first data used for training purposes may comprise measured data of the first measuring apparatus and the corresponding second data may comprise measured data of the second measuring apparatus. The first data used for training purposes may comprise simulated data of the first measuring apparatus and the corresponding second data may comprise simulated data of the second measuring apparatus. In particular, the simulated data of the second measuring apparatus may comprise a simulated aerial image. Further, the first data used for training purposes may comprise measured data of the first measuring apparatus and the corresponding second data may comprise simulated data of the second measuring apparatus. Moreover, the first data used for training purposes may comprise simulated data of the first measuring apparatus and the corresponding second data may comprise measured data of the second measuring apparatus.

Training the transformation model may comprise: (a) training the transformation model in a first step using a first number of first data used for training purposes and second data corresponding therewith, which are linked to the second measuring apparatus, wherein the first data used for training purposes comprise simulated data of the first measuring apparatus and the second data corresponding therewith, which are linked to the second measuring apparatus, comprise corresponding simulation data of the second measuring apparatus; and (b) training the transformation model in a second step using a second number of first data used for training purposes and second data corresponding therewith, which are linked to the second measuring apparatus, wherein the first data used for training purposes comprise measured data of the first measuring apparatus and the second data corresponding therewith, which are linked to the second measuring apparatus, comprise measured data of the second measuring apparatus.

Producing simulated data of the first measuring apparatus may comprise simulating various parameter settings of the first measuring apparatus. Producing simulated data of the first measuring apparatus may comprise simulating a defect-free region of the element of the photolithography process and/or a defective region of the element. Further, producing simulated data of the first measuring apparatus may comprise simulating a partly repaired region of the element Producing simulated data of the second measuring apparatus may comprise simulating aerial images on the basis of design data of the element of the photolithography process. Moreover, producing simulated data of the second measuring apparatus may comprise simulating aerial images on the basis of modified design data of the element of the photolithography process.

According to another aspect of the present invention, the problem specified above is solved by an apparatus for checking at least one region of an element of a photolithography process, the apparatus may comprise: (a) a measuring apparatus for recording measurement data of the region; and (b) a model for transforming the measurement data and reference data associated with the measurement data into a quality measure of the element, said quality measure containing an information item about effects of the region of the element when carrying out a photolithography process; (c) wherein the model has been trained using a multiplicity of measurement data used for training purposes, reference data associated with the measurement data and corresponding quality measures.

A second apparatus according to the invention facilitates the direct ascertainment of a quality measure for an element of a photolithography process on the basis of measurement data of a region of the element and the reference data associated with the measurement data. Hence, a second apparatus according to the invention avoids measuring an aerial image for assessing the quality of an element for a photolithography process, in a manner similar to the first apparatus according to the invention, which is described above.

According to another further aspect of the present invention, the problem specified above is solved by an apparatus for transforming measurement data of a region of an element of a photolithography process, recorded using a measuring apparatus, and reference data associated with the measurement data into a quality measure of the element, wherein the model has been trained using a multiplicity of measurement data that are used for training purposes, reference data associated with the measurement data and corresponding quality measures.

An apparatus according to the invention, as defined in the preceding paragraph, allows the measurement of the measurement data to be decoupled from the application of a trained model for the purposes of transforming the measurement data and the reference data associated with the measurement data into a quality measure of the element of the photolithography process. As a result, ascertaining a defect map can be separated in time and space from recording the measurement data for a region of the element. Hence, for example, an apparatus according to the invention in question can use measurement data of an inspection tool and reference data as input data and can determine a quality measure on the basis of these data, the quality measure serving as a basis for the further processing of the element.

A quality measure of a region of an element can be transformed into a quality measure of the element by considering the quality measures of the various regions of the element.

The corresponding quality measures can be generated on the basis of measured data and associated reference data. Further, the corresponding quality measures can be produced on the basis of simulated data and associated reference data. The associated reference data may comprise measured reference data and/or simulated reference data. Moreover, use can be made of a predictor in order to generate assessments instead of reference data from design data. Moreover, the predictor is designed to make a decision as to whether a defect is present in the region of the element on the basis of the assessments and the measurement data of the measuring apparatus.

The quality measure may comprise at least one element from the group: a difference image between an image of the region of the element and a reference image of the region of the element, a qualified defect map of the region of the element, which contains an information item about effects of the defects specified in the defect map when carrying out the photolithography process, a yes/no statement as to whether the region of the element can be used in a photolithography process.

A difference image specifies a deviation from a reference image for each pixel of a region of the element or for the entire element. A qualified defect map specifies an effect of a deviation of the pixel from the reference data in respect of a photolithography process for each pixel of a defect map of a region of the element or for the entire element. The deviation can be considered in absolute terms, relative terms or as a probability of a deviation. The yes/no statement in relation to a region of an element or for the entire element describes whether or not a region or an element, for example a photomask, produces a defect that is visible or that acts on a wafer.

The model for transforming the measurement data can be fitted to the quality measure.

The measurement data may comprise data of at least one element from the group: a scanning particle microscope, a scanning probe microscope and an interferometer, and/or the reference data may comprise data of a defect-free region of the element.

It is an advantage of an apparatus according to the invention that a repair tool can be used for the quality assessment of an element of a photolithography process, without the element to be analyzed needing to be transported and aligned with respect to a second measuring apparatus.

The measurement data may comprise measured data of a scanning electron microscope and/or the reference data may comprise an aerial image. The aerial image may comprise a measured aerial image or a simulated aerial image. The measurement data may be transformed into an aerial image and/or the reference data may comprise a reference aerial image. Further, the reference data may comprise design data of the element of the photolithography process.

The measurement data, the reference data associated with the measurement data and the qualified defect map may have the same number of pixels.

The aerial image may comprise a series of aerial images with a diversification of the optical imaging conditions, for example, the series of aerial images may comprise an aerial image focus stack, and/or the reference aerial image may comprise a reference aerial image focus stack.

The region of the element of the photolithography process may comprise a region with a defect and/or the region may comprise a repaired defect.

The measurement data used for training purposes may comprise measurement data of a defect-free region of the element, may comprise measurement data of a region of the element with a repaired defect, and/or may comprise measurement data of a region of the element with an incompletely repaired defect.

In order to comprehensively train a model for transforming measurement data, it is expedient if measurement data originate from regions of the element that are defect free, the defects of which were repaired and/or the defects of which were repaired in part, i.e., incompletely. The reference data associated with the measurement data, which originate from the aforementioned different regions of the element, may contain an ideal or approximated image of a substantially error-free but deliberately approximated region of an element, wherein the imaging can be measured or simulated. As an alternative or in addition thereto, the reference data may contain suitable descriptions of the structure or pattern elements of the photomask to be imaged, for instance as design data in the form of polygonal trains or rastered images.

The apparatus may comprise a scanning electron microscope, which is embodied to scan the element of the photolithography process and which is further embodied to repair a defect of the element of the photolithography process.

On the one hand, an electron beam is suitable for highly precisely scanning of a region of an element of a photolithography process and, on the other hand, a defect of the element can be effectively repaired with the aid of an electron beam. The capability of a modified scanning electron microscope can be increased yet again should it be possible to transform the image produced by the electron beam under the provision of reference data into a quality measure on the basis of which a decision can be made as to whether the element need be repaired.

The transformation model may comprise a model of machine learning. The model for transforming the measurement data may comprise a model of machine learning.

The training of the model for transforming the measurement data may comprise: comparing the measurement data used for training purposes and the reference data associated with the measurement data with the corresponding quality measures.

The production of corresponding quality measures may comprise: measuring corresponding measured quality measures or simulating corresponding simulated quality measures. Measuring corresponding measured quality measures may comprise measuring an aerial image and comparing the aerial image with a reference aerial image. A reference aerial image may comprise measuring a reference aerial image and/or simulating a reference aerial image. Simulating corresponding simulated quality measures may comprise simulating an aerial image and comparing the latter with a reference aerial image.

The production of simulated aerial images may comprise: carrying out a rigorous simulation by numerically solving Maxwell's equations, wherein design data and/or modified design data of the element of the photolithography process are used as input data, and/or carrying out a simulation with the aid of a Kirchhoff model, wherein the design data and/or the modified design data of the element of the photolithography process are used as input data.

Comparing the measurement data used for training purposes and the reference data associated with the measurement data with the corresponding quality measures may comprise a pixel-by-pixel comparison. Further, the comparison of the measurement data used for training purposes and the reference data associated with the measurement data with the corresponding quality measures may be implemented on the basis of a critical dimension (CD) and/or an image contrast.

The pixel of the measurement data, the pixel of the measurement data used for training purposes, the pixel of the reference data associated with the measurement data or measurement data used for training purposes and the pixels of the corresponding quality measure may comprise a greyscale value representation. The number of bits for a pixel may comprise a range of 1 bit to 8 bits, preferably 1 bit to 16 bits, more preferably 1 bit to 32 bits and most preferably 2 bits to 64 bits.

The apparatus may comprise a computing unit, which is embodied to carry out the trained transformation model and/or the trained model for transformation purposes. The apparatus may comprise a computing unit, which is further embodied to train the transformation model and/or the model for transformation purposes.

The model of machine learning may comprise at least one element from the group: a parametric mapping, an artificial neural network (ANN), a deep neural network (DNN), a time delay neural network, a convolution neural network (CNN), a recurrent neural network (RNN), a long short-term memory (LSTM) network, and a generative model.

The model of machine learning may comprise: (a) at least one encoder block for determining information-carrying features from the first data of the element or from the measurement data of the region of the element; and (b) at least one decoder block for transforming the first data into second non-measured data, which correspond to measurement data of a measurement of the element with a second measuring apparatus, or transforming the measurement data and reference data associated with the measurement data into a quality measure, which contains information about effects of the region of the element in carrying out the photolithography process.

The model of machine learning may comprise: (a) two or more encoder layers for determining information-carrying features from the first data; and (b) two or more decoder layers for producing the second, non-measured data, which correspond to measurement data of an examination of the element of the second measuring apparatus.

The model of machine learning may comprise: (a) two or more encoder layers for determining information-carrying features from the measurement data of the region; and (b) two or more decoder layers for transforming the measurement data of the region and reference data associated with the measurement data into a quality measure of the element.

The apparatus may be embodied to fit a number of the encoder layers and/or decoder layers of the transformation model and/or of the model for transforming the measurement data to a predetermined accuracy of the second, non-measured data.

Further, the apparatus may be embodied to fit a number of the encoder layers and/or decoder layers of the transformation model and/or of the model for transforming the measurement data to a predetermined accuracy of the defect map of the element.

Outputs of at least one of the layers of the transformation model and/or of the model can be used as inputs for at least one non-adjacent layer of the transformation model and/or of the model for transforming the measurement data.

The transformation model and/or the model for transforming the measurement data can be embodied to provide outputs of at least one layer of the encoder as input to at least one layer of the decoder. The outputs of an encoder layer can be provided to a corresponding layer of the decoder as inputs.

By way of results of one or more encoder layers being provided to one or more corresponding decoder layers of the transformation model and/or the model for transforming the measurement data, the bottleneck of the central feature layer is at least partly circumvented. As a result, the spatial information of the input data can be maintained, leading to higher spatial accuracy of the output data at the output of the encoder of the transformation model and/or model. In the article "U-Net: Convolutional networks for biomedical image segmentation", 18$^{th}$ Intern. Conf. on Medical Image Computing and Computer-Assisted Intervention (MICCAI), 5-9 Oct. 2015, in Munich, the authors O. Ronneberger, P. Fischer and T. Brox verified this relationship by pixel-accurate segmentation of medical data.

The transformation model and/or the model for transforming the measurement data can be embodied to provide the outputs of at least one layer of the encoder as inputs to at least one next but one layer, or a layer further away, of the encoder, and/or the outputs of at least one layer of the decoder can be provided as inputs to at least one next but one layer, or a layer further away, of the decoder.

By shorting the outputs of two non-adjacent convolutional layers of an encoder, the results of non-adjacent encoder layers are combined (e.g., added or concatenated) and provided together to a subsequent encoder layer. As a result, transformation models or models for transforming can be reliably trained in the form of generative models with a larger number of layers, facilitating a greater imaging accuracy. In the article "Deep residual learning for image recognition," IEEE Conf. on Computer Vision and Pattern Recognition (CVPR), Jun. 26-Jul. 1, 2016, Las Vegas, Nevada, USA, pages 770-778, the authors K. He et al. report about the improvement of the training behavior of fully convolutional networks FCN by feedforward wiring of encoder-decoder architectures with a layer number of up to 152 layers.

The transformation model and/or the model for transforming the measurement data can be embodied to arrange two or more layers, which carry out the same function, in a block and to provide the inputs at the block to each of the layers within the block and to combine the outputs of each of the layers of the block at the output of the block.

The layers within the block may comprise convolutional layers. Further, the block may comprise a combination node after each layer, the combination node combining the outputs of two or more layers. The block may comprise four layers and four combination nodes.

The transformation model and/or the model for transforming the measurement data can be embodied to install one or more blocks into the encoder and/or install one or more blocks into the decoder and to use the one block or the plurality of blocks of the encoder as additional inputs of the one block or the plurality of blocks of the decoder.

A transformation model and/or a model for transforming the measurement data, which contains two or more of the above-defined blocks, extends the data flow within the encoder-decoder architecture. As a result, the spatial resolution is firstly improved in relation to conventional encoder-decoder systems, in which only adjacent layers are connected, and the learnability of the transformation model or of the model is improved at the same time. In the publication "The One Hundred Layers Tiramisu: Fully Convolutional DenseNets for Semantic Segmention," Computer Vision and Pattern Recognition, Dec. 5, 2016, arXiv: 1611.09326, the authors S. Jégou et al. describe the above-defined block and the installation thereof into a CNN for solving problems of semantic image segmentation.

A first and at least one second refinement module can be inserted into an encoder of the transformation model and/or the model for transforming the measurement data, the outputs can be obtained as inputs after each clustering step, wherein the at least one second refinement module additionally receives the outputs of the first refinement module.

A first and at least one second refinement module can be inserted into an encoder, the outputs can be obtained as inputs after each pooling step, wherein the at least one second refinement module additionally receives the outputs of the first refinement module. The refinement module may comprise an output convolution unit.

A refinement module uses the different detailing stages of convolution operations within the encoder and fuses these in order to make a highly resolved prediction. The above-explained refinement module and the use thereof in an encoder of a CNN (convolutional neural network) is described by the authors G. Lin et al. in the article "RefineNet: Multi-path refinement networks for high-resolution semantic segmentation," IEEE Cent. on Computer Vision and Pattern Recognition (CVPR), Jun. 26-Jul. 1, 2016, Las Vegas, Nevada, USA, arXiv preprint arXiv: 1611.09326.

Should the quality measure comprises a yes/no statement as to whether the region of the element can be used in a photolithography process, the model for transforming the measurement data may comprise an encoder block and a mapping model, which maps the information-carrying features of the measurement data onto a class probability. The encoder block may comprise a plurality of convolution operations and pooling operations. The mapping model may comprise a multi-layer perceptron (MLP). Under the aforementioned boundary conditions, the model for transforming the measurement data may also comprise a deep convolutional neural network (CNN), which has one or more fully connected layer(s) at its output. In the case of fully connected layers, the outputs of one layer are provided as inputs to all subsequent layers.

According to another aspect of the present invention, the problem specified above is solved by a method for checking at least one region of an element of a photolithography process, the method may comprise the steps of: (a) recording measurement data of the region with a measuring apparatus; and (b) applying a model for transforming the measurement data and reference data associated with the measurement data into a quality measure of the element; (c) wherein the model has been trained using a multiplicity of measurement data used for training purposes, reference data associated with the measurement data and corresponding quality measures. The quality measure may contain an information item about effects of the region of the element when carrying out a photolithography process.

Step b. may further comprise the step of: releasing the element for the photolithography process on the basis of the quality measure.

Evaluating the quality measure may comprise comparing the defects or the defects remaining after a repair with one or more predetermined thresholds. On the basis of the comparison, it is possible to ascertain whether the element can be released for use thereof in a photolithography process, whether it should be subjected to a further repair process or whether it should be discarded.

Training the transformation model and/or the model for transforming the measurement data may comprise supervised learning. Supervised learning is described in the book "Pattern Recognition and Machine Learning" by C. M, Bishop, Springer 2006, ISBN-10: 0-387-31073-8.

Training the transformation model and/or the model for transforming the measurement data may comprise determining learnable parameters of the model of machine learning. Training the transformation model and/or model to transform may comprise determining entries of filter masks of the convolution layers and deconvolution layers.

The training of the model for transformation purposes may comprise: (a) training the model for transformation purposes in a first step using a first number of measurement data, used for training purposes, of the region of the element, reference data associated with the measurement data and corresponding quality measures, wherein the measurement data and the associated reference data comprise simulated measurement data and simulated associated reference data; and (b) training the model for transformation purposes in a second step using a second number of measurement data, used for training purposes, of the region of the element, reference data associated with the measurement data and corresponding quality measures, wherein the measurement data comprise measured measurement data and the associated reference data comprise measured reference data, and wherein the first step is carried out before the second step.

The first number of data records used for training purposes may be greater than the second number of data records used for training purposes. The first number of data records used for training purposes may be greater than the second number of data records used for training purposes by a factor of 10.

Further, training the model for transformation purposes may comprise running through steps a. and b. at least twice.

BRIEF DESCRIPTION OF DRAWINGS

The following detailed description describes currently preferred exemplary embodiments of the invention, with reference being made to the drawings, in which:

FIG. 10 shows a flowchart of a second method for checking at least one region of an element of a photolithography process by transforming measurement data of a measuring apparatus and associated reference data into a quality measure with the aid of a trained model.

DETAILED DESCRIPTION

Currently preferred embodiments of apparatuses according to the invention and methods according to the invention are explained in more detail on the basis of the transformation of measurement data of a scanning electron microscope into an aerial image and the production of a qualified defect map or a quality measure on the basis of measurement data of the scanning electron microscope and corresponding reference data for a photolithographic mask. However, the methods and apparatuses according to the invention are not restricted to the application of measurement data of a scanning electron microscope. Instead, apparatuses and methods according to the invention can be used to transform the measurement data of any scanning particle microscope or optical microscope. Moreover, the apparatuses and methods described in this application can be used to transform measurement data or to produce qualified defect maps or quality measures from measurement data of a scanning probe microscope.

Further, the application of apparatuses and methods according to the invention is not restricted to the photomasks described below; these should merely be considered as an example of an element of a photolithography process. Rather, said apparatuses and methods can be applied to further elements of a photolithography process, for example to a template or a mold of nanoimprint lithography, which can be used instead of a photomask. Further, the methods and apparatuses according to the invention can be used to assess the quality of a wafer during the processing processes thereof. In general, the apparatuses and methods described in this application can be used to analyze objects whose defects can be imaged or whose corresponding reference data are present.

Figure 1:
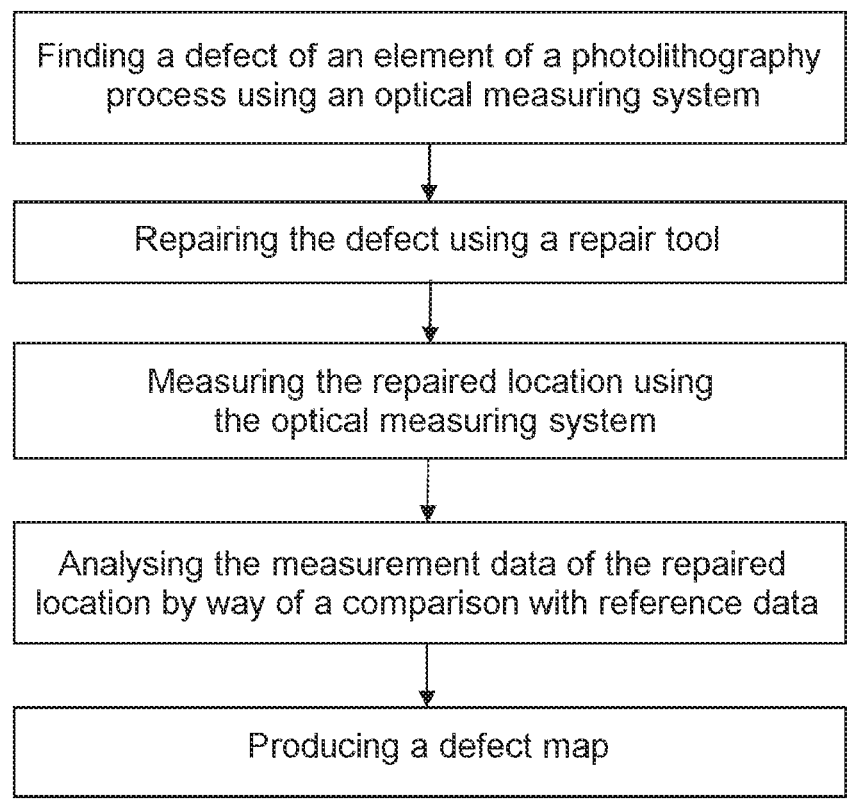
FIG. 1 schematically reproduces the current workflow for assessing the quality of an element of a photolithography process.

FIG. 1 schematically shows a current workflow for repairing defects of a photomask. In a first step, a defect of a photolithographic mask or, more generally, a defect of an element of a photolithography process is found using an optical inspection system. Thereupon, the identified defect is measured in detail where necessary using an optical measuring system. A defect may comprise a placement error of one or more pattern elements of a photomask. Further, a defect may comprise missing or excess material of one or more pattern elements of a mask. Moreover, a defect may comprise a limit of a critical dimension (CD) of one or more pattern elements of a photolithographic mask being exceeded. By way of example, an optical measuring system may comprise an AIMS™ (Aerial Image Metrology System) tool, a WLCD tool and/or a PROVE® tool.

The identified defect is repaired using a repair tool in the next step. An example of a repair tool is described in detail in the context of FIG. 5.

After the defect has been repaired, the repaired location is analyzed again by the optical measuring system in order to check whether the repair has brought about the intended result. To this end, the measurement data of the repaired location are compared to reference data. The reference data are data of a region of the photolithographic mask, which has the same pattern elements as the defective region, but which is defect free. A defect map or defect probability map is produced as a result of the analysis process.

Figure 2A:
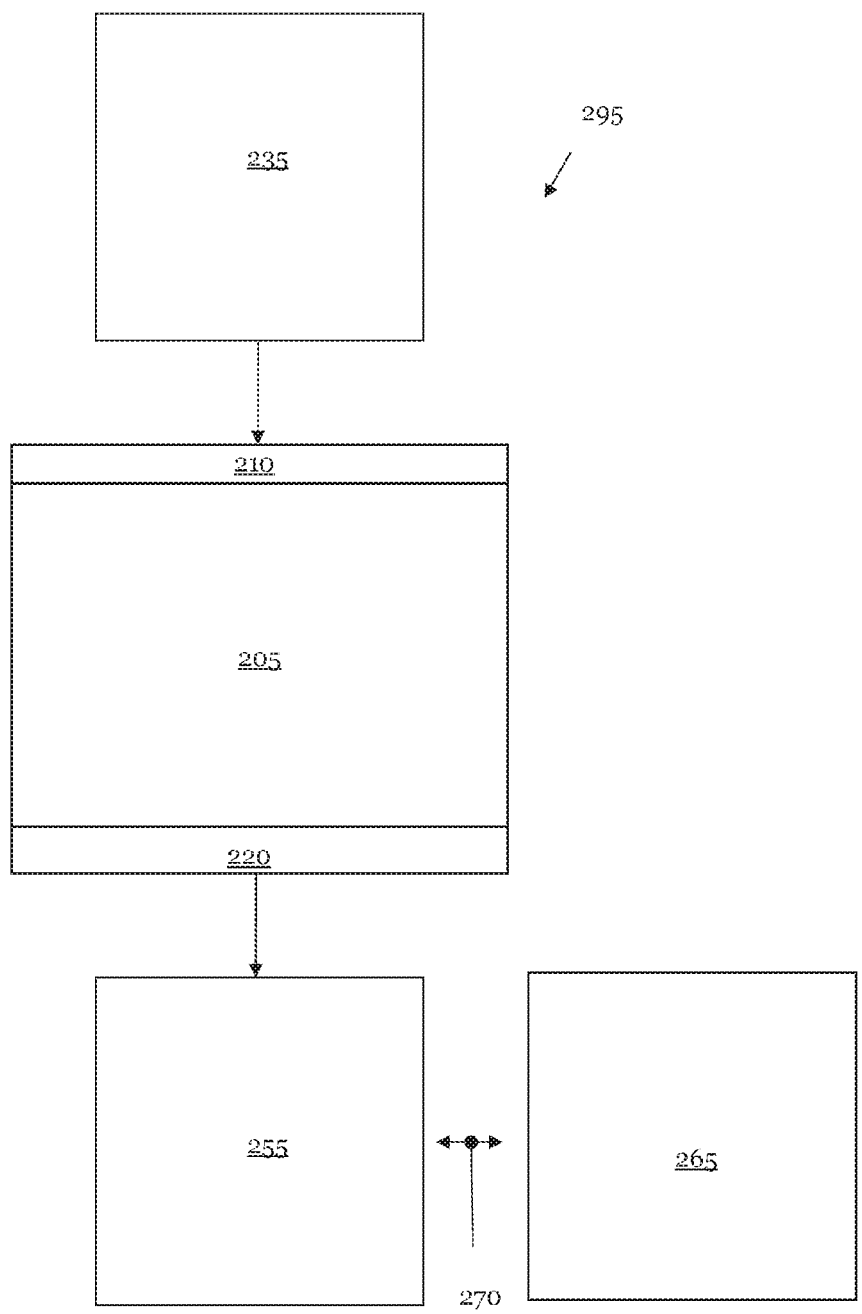
FIG. 2A schematically shows an example of a transformation model with an input layer, an output layer and the associated input and output data during the training phase.

The diagram 295 of FIG. 2A schematically shows the training of a transformation model 205, which transforms measurement data, which were measured by a first measuring apparatus, into second, non-measured data during the subsequent operation. Before the transformation model 205 can generate transformed, second data from the measurement data, the transformation model 205 must be trained for this objective by way of a comprehensive data record or training data record. During the training phase, the transformation model 205 in training or the learning transformation model generates a prediction of the transformed, second data 255 from the first data 235 used for training purposes. The predicted transformed second data 255 are compared with the corresponding second data 265 of the training data record linked to the second measuring apparatus. This is symbolized by the double-headed arrow 270 in FIG. 2A.

Measurement data 235 used for training and the measurement data are provided by way of an input layer 210 both during training and operation of the transformation model in training 205 and trained transformation model, and the transformation model in training 205 outputs a prediction of the transformed second data 255 via the output layer 220.

There are various methods for fitting the parameters of the transformation model 205 in the training phase, depending on the chosen transformation model. The "stochastic gradient descent" iterative technique has become established for DNNs (deep neural networks), which have a multiplicity of parameters. In so doing, the training data are repeatedly "presented" to the learning transformation model 205, i.e., the latter calculates a prediction of transformed second data 255 from the first data 235 used for training purposes with the current parameter set and compares the transformed second data 255 with the corresponding second data 265 of the training data record, which are linked to the second measuring apparatus. By way of example, this comparison can be implemented pixel-by-pixel. Parameters of the learning transformation model 205 are fitted if deviations arise between the predicted second transformed data 255 and the corresponding second data 265 that are linked to the second measurement apparatus. The training phase typically ends when a local optimum has been reached, i.e., the deviations of the pairs of predicted transformed second data 255 and corresponding second data 265 that are linked with the second measuring apparatus no longer vary, or else after a predetermined time budget for the training cycle of the learning transformation model 205 has been used up or after a predetermined number of training steps. Alternatively, a training process of the transformation model 205 can be completed when the validation accuracy drops significantly when use is made of a separate validation data record, this being an indication for overfitting of the transformation model 205.

The first data 235 used for training purposes may comprise measurement data that were measured by a first measuring apparatus. The first data 235 used for training purposes may also comprise simulated data for the first measuring apparatus. The corresponding second data 265 linked to the second measuring apparatus may contain second data measured by the second measuring apparatus. Further, the corresponding second data 265 linked to the second measuring apparatus may comprise corresponding simulation data instead of second data measured by the second measuring apparatus. Further, the first data 235 used for training purposes may comprise data measured by the first measuring apparatus and the corresponding second data 265 linked to the second measuring apparatus may comprise simulation data of the second measuring apparatus.

Figure 2B:
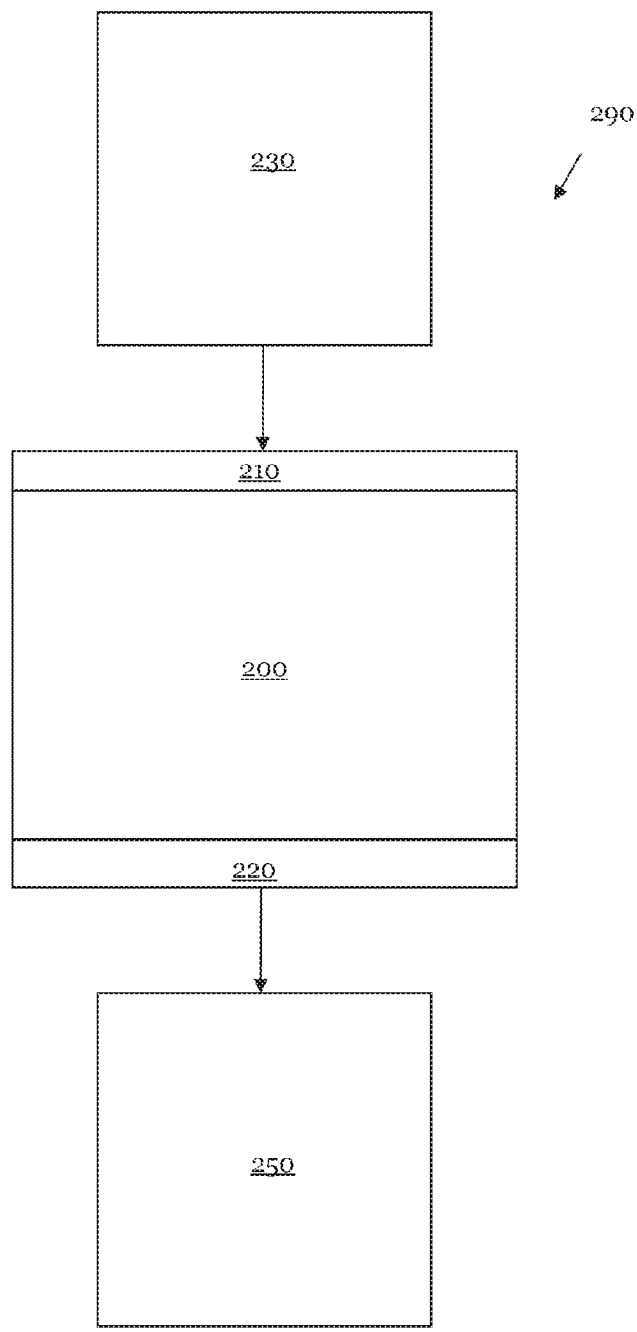
FIG. 2B schematically reproduces the exemplary transformation model of FIG. 2A during the operational phase.

The diagram 290 of FIG. 2B schematically shows the operation of a trained transformation model 200, which transforms measurement data 230, which were measured by a first measuring apparatus, into second, non-measured data 250. The measurement data 230 are provided to the trained transformation model 200 via the input layer 210. By way of its output layer 220, the trained transformation model 200 supplies the second non-measured data 250.

Figure 3A:
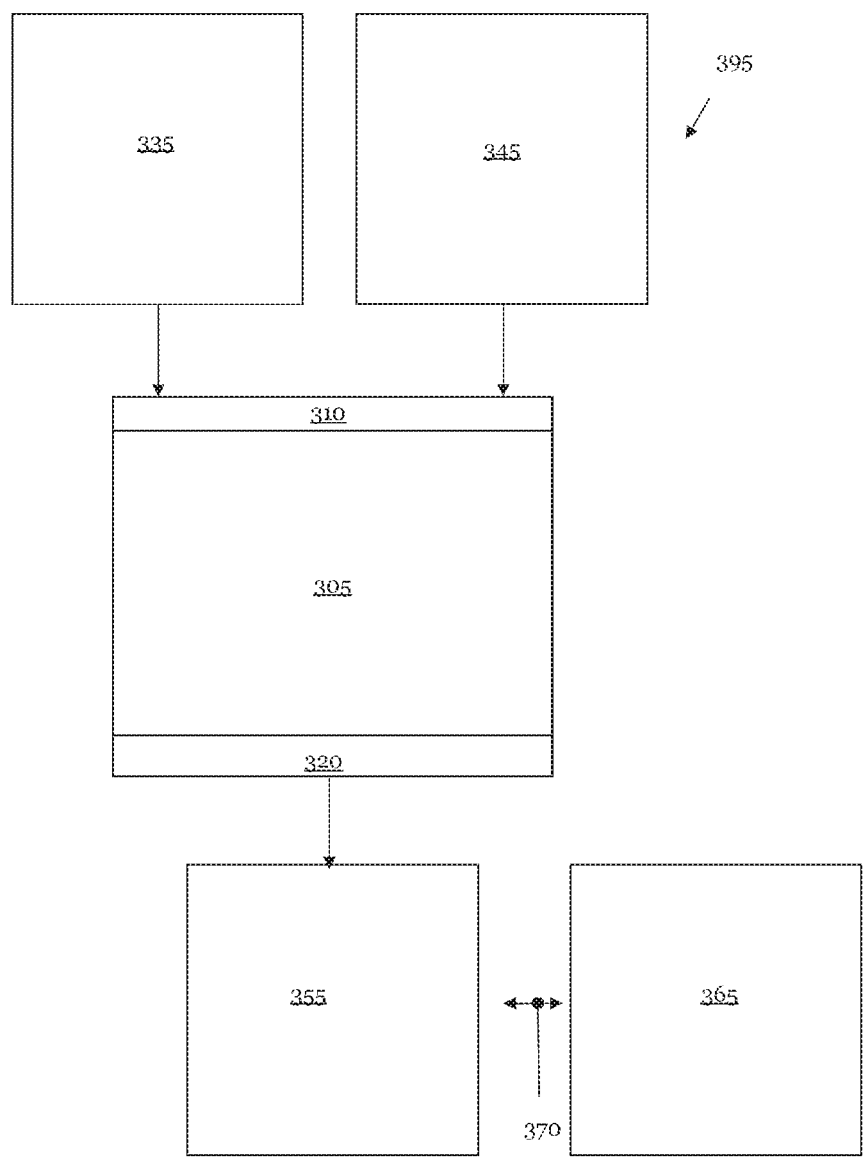
FIG. 3A schematically reproduces an example of a model for transformation purposes with an input layer, an output layer and the associated input data and output data during the training phase.

The diagram 395 of FIG. 3A schematically shows a training process in order to train a model in training for transforming 305 the measurement data for its objective. For the model in training for transformation purposes 305, illustrated in FIG. 3A, the training data comprise measurement data 335 of the measuring apparatus used for training purposes and the reference data 345 associated with the measurement data 335 used for training purposes as input data, which are provided to the input layer 310 of the learning model 305. The learning model 305 predicts a quality measure 355 of a region of a photomask or, more generally, of a region of an element of a photolithography process from the measurement data 335 used for training purposes and the associated reference data 345. The predictive quality measure 355 is compared with the corresponding quality measure 365 of the training data record. In FIG. 3A, the comparison between the predictive quality measure 355 and the corresponding quality measure 365 is elucidated, once again, by the double-headed arrow 370. The training process of the learning model for transforming 305 the measurement data 330 is implemented in analogous fashion to the training process for the transformation model 205 in training, as described in the context of FIG. 2A. Therefore, reference is made here to the description of FIG. 2A.

Figure 3B:
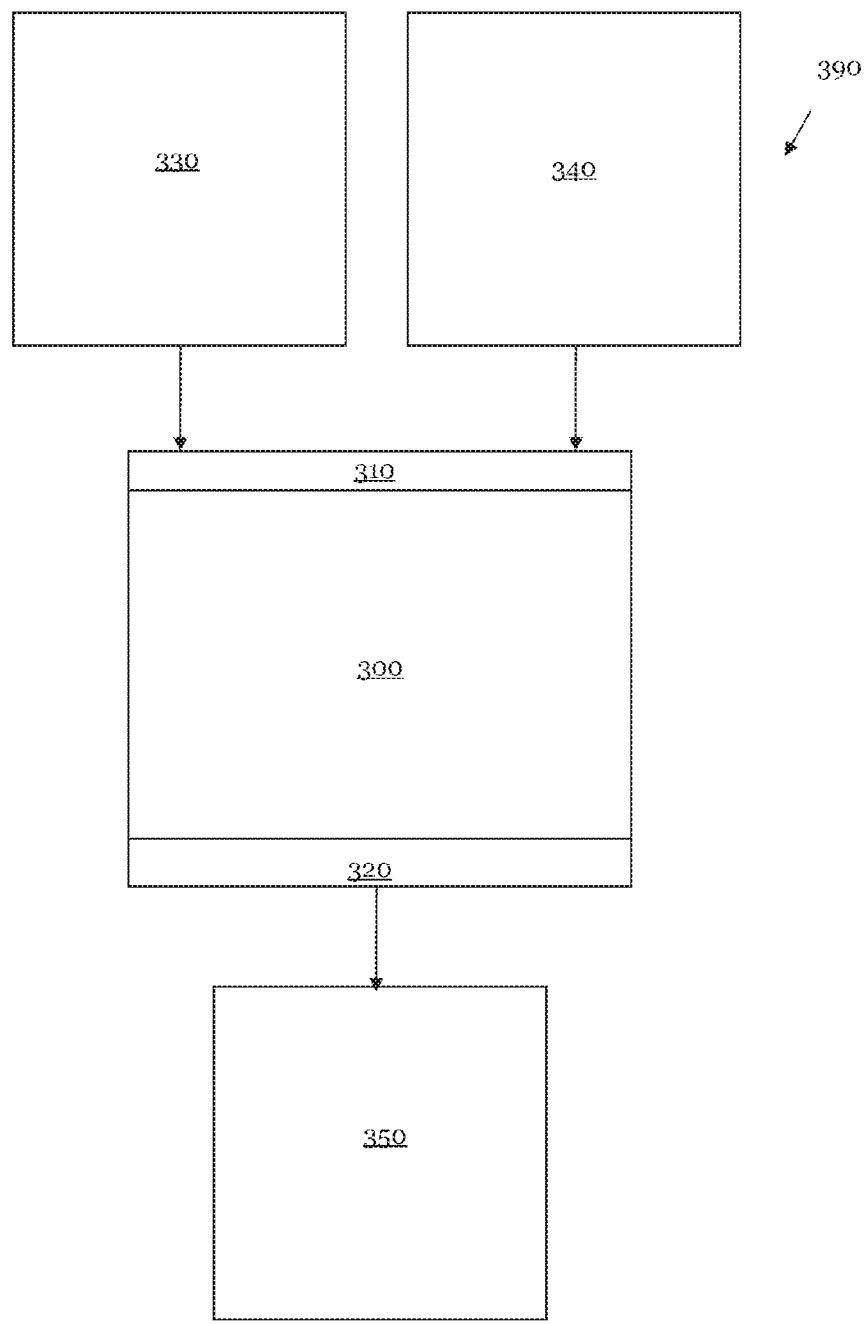
FIG. 3B schematically represents the model for transformation purposes of FIG. 3A during the operational phase.

The diagram 390 of FIG. 3B schematically presents the operation of the trained model for transforming 300 measurement data 330. The measurement data 330 and the associated reference data 340 are provided to the trained model 300 via the input layer 310. At the output of the output layer 320, the trained model 300 supplies a quality measure 350 of the photolithographic mask.

Below, a generic and a trained transformation model or model for transformation purposes are denoted by the reference signs 200 and 300, respectively. A learning transformation model and a learning model for transformation purposes are denoted by the reference signs 205 and 305, respectively.

The transformation model 200 and/or the model for transformation purposes 300 may comprise a model of machine learning. The transformation model 200 and/or the model for transformation purposes 300 may comprise an artificial neural network (ANN). The ANN may comprise a deep neural network. It is expedient to fit the transformation model 200 and/or the model for transforming 300 the measurement data 330 to the required prediction accuracy of the transformed first data 250 or of the quality measure 350. By way of example, fitting the transformation model 200 or the model for transforming 300 the measurement data 330 can be implemented by an appropriate selection of the number of layers of the model of machine learning. As an alternative or in addition thereto, it is advantageous to fit the functional description of the transformation model 200 and/or of the model for transforming 300 the measurement data 330 to the objective to be solved, specifically the transformation of first data 230 into the second data 250 or the transformation of measurement data 330 and associated reference data 340 into a quality measure 350 of a photolithographic mask.

The number of pixels of the input images may lie in a range from, e.g., 32×32 to 2048×2048 pixels. A range from 224×224 to 2048×2048 pixels was found to be particularly expedient. The input layers 210 and 310 of the transformation model 200 or the model for transforming 300 the measurement data 330 are fitted to the size of the input images. Likewise, the number of convolutional layers and of the pooling layers of the transformation model 200 or of the model 300 are fitted to the size of the input layer. Further, the number of free model parameters of the transformation model 200 and of the model for transforming 300 the measurement data 330 is fitted to the complexity of the objective to be solved. In addition to the training of the models 200, 300, these may be validated prior to the use thereof by a validation data record.

Figure 4:
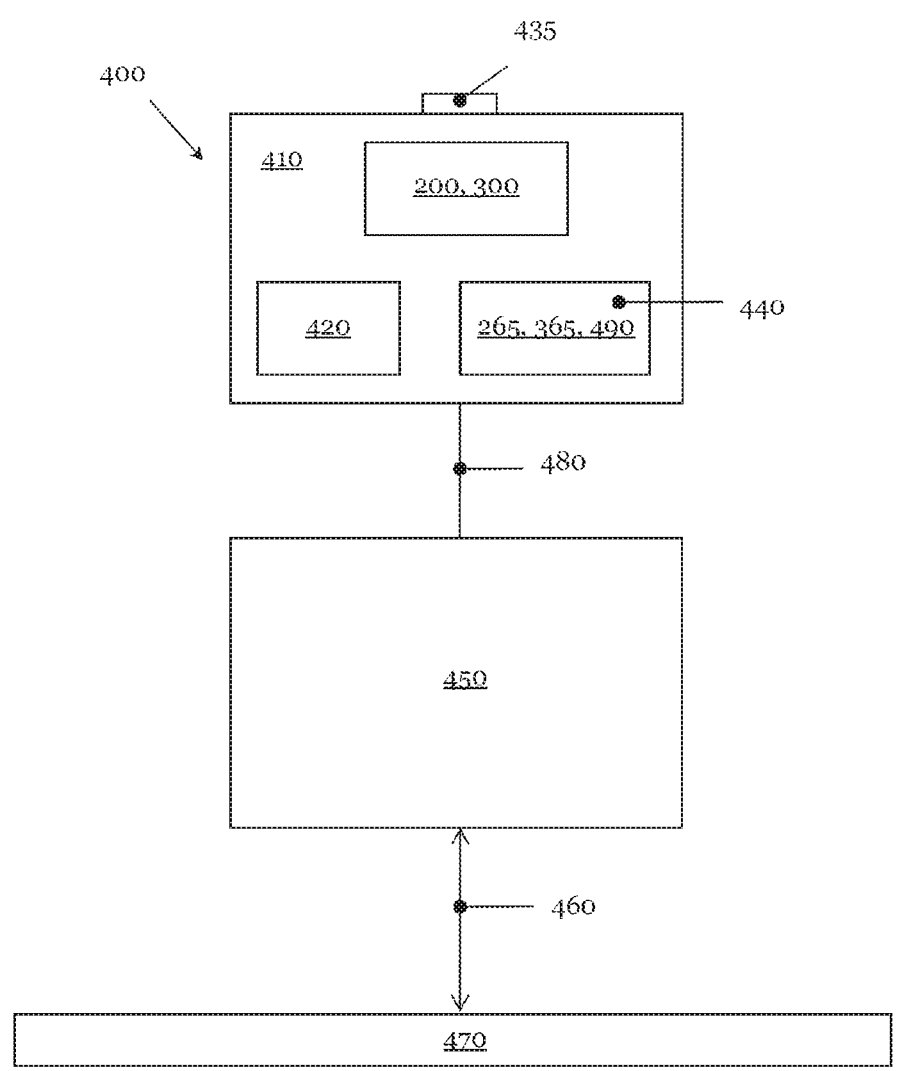
FIG. 4 schematically represents a section through a second measuring apparatus.

FIG. 4 schematically shows a section through an optical measuring system 400 or a second measuring apparatus 400, which can be used for determining second data 265 used for training purposes and linked to the second measuring apparatus 400. Further, the optical measuring system 400 can be used to generate associated reference data 340, associated reference data 345 used for training purposes and corresponding defect maps 365, which are required for the purposes of training the model 300. Consequently, the optical measuring system 400 produces corresponding data 265 used for training purposes or quality measures 365 for the transformation model 200 or the model for transformation purposes 300 and additionally reference data 340 associated with the measurement data 220 or the measurement data 225 used for training purposes or associated reference data 345 used for training purposes. The second measuring apparatus 400 or the measuring apparatus 400 can generate the data 265, 340 and 345 in the form of aerial images 420. Moreover, the aerial images 420 can be used as input data for establishing corresponding quality measures 365.

The apparatus 400 comprises a computer system 410, which is linked to a measuring device 450 by way of a connection 480. The connection 480 may be embodied in a wired or wireless manner. In the example illustrated in FIG. 4, the measuring device 450 examines the photolithographic mask 470 by means of the interaction 460. The mask 470 can be a transmitting or a reflecting mask. The photomask 470 may comprise any mask type. The photomask 470 of FIG. 4 is an example of an element 470 of a photolithography process.

The measuring device 450 can be an imaging measuring device 450. In the example illustrated in FIG. 4, the measuring device 450 comprises an AIMS™ or an AIMS™ EUV, i.e., an AIMS for the extreme ultraviolet wavelength range. However, it is also possible for the measuring device 450 to be embodied as a PROVE® tool (not illustrated in FIG. 4). An AIMS™, which uses light at the actinic wavelength or in the vicinity of the actinic wavelength, is preferred as a measuring device 450 as the latter produces an aerial image of the photomask 470 that comes very close to an image of the mask 470 that the latter generates in the photoresist applied to a wafer during a photolithography process.

The measuring device 450 can be used to produce an aerial image focus stack by varying the focal plane. As a result, the measuring device 450 facilitates the measurement of an aerial image focus stack of the mask 470.

In addition to an imaging measuring device 450, which analyzes the mask 470 and produces an aerial image 420 by means of an interaction 460 with photons, the measuring device 450 may, however, also interact 460 with the mask 470 with the aid of a neutral or charged particle beam (not illustrated in FIG. 4) and may generate corresponding second data 265 linked to the second measuring apparatus 400 or measurement data for corresponding quality measures 365 of a sample, for example the photolithographic mask 470, on the basis of reflected and/or transmitted neutral and/or charged particles.

The computer system 410 controls the measuring device 450 by way of the connection 480. Further, the computer system 410 receives measurement data of the measuring device 450 by way of the connection 480. The computer system 410 of FIG. 4 can produce an aerial image 420 from the measurement data of the measuring device 450.

Further, the computer system 410, illustrated in FIG. 4, of the optical measuring system 400 or of the second measuring apparatus 400 comprises an interface 435, by means of which the computer system 410 can interchange data with a further measuring apparatus. The interface 435 can be a wireless or wired communications interface to an intranet or the Internet or can provide said wireless or wired communications interface to another measuring apparatus. Further, the interface 435 may comprise a data medium drive.

Moreover, the computer system 410 may comprise a model of machine learning, for instance the transformation model 200 and/or the model for transformation purposes 300. Moreover, the computer system 410 may comprise a memory 440, which stores corresponding second data 265 that are linked to a second measuring apparatus 400 and/or corresponding quality measures 365, i.e., second parts of a training data record for the transformation model 205 in training and/or for the model for transformation purposes 305 in training. The computer system 410 can receive the first parts of a training data record by the interface 435, i.e., first data 235 used for training purposes and/or measurement data 335 used for training purposes and reference data 345 associated with the measurement data 335 used for training purposes. The transformation model 200 and/or the model 300 can be trained for its objective on the basis of these training data.

In order to be able to efficiently train, and also effectively operate, the transformation model 200 or the model 300, it is advantageous if the exemplary computer system 410 illustrated in FIG. 4 contains one or more capable graphics processors (GPU, graphical processing unit) or other objective-optimized computer hardware, for instance a tensor processing unit (TPU) by Google (not shown in FIG. 4).

As explained above, the apparatus 400 can be used to produce corresponding second data 265 that are linked to the second measurement apparatus 400, said second data being able to be used as part of a training data record for training a transformation model 200. Further, the apparatus 400 or the second measuring apparatus 400 can be used to generate corresponding quality measures 365, which are part of a training data record for the model for transformation purposes 300. Moreover, the second measuring apparatus 400 can be used to determine reference data 345 associated with the measurement data 335 used for training purposes. The associated reference data 345 can be produced, on the one hand, by a measurement using the measuring device 450. Then, the associated reference data 345 are available in the form of reference aerial images. On the other hand, the computer system 410 can generate reference data 345 associated with the second measuring apparatus 400 by simulation from design data 490 of the photolithographic mask 470. The design data 490 can be stored in the memory 440 of the computer system 410 or received by the computer system 410 via the interface 435.

A currently frequently used method for ascertaining a corresponding quality measure 365 for a photolithographic mask 470 provides the determination of associated reference data 345 in the form of a reference aerial image for a region of the mask 470 to be examined in a first step of a first embodiment. If a mask 470 comprises many regions or partial areas, or at least a plurality thereof, which contain the same arrangement of pattern elements, a defect-free region of the mask 470 can be selected to record associated reference data 345 in the form of a reference aerial image. By way of example, a measuring device 450 in the form of an AIMS™ can be used to measure an aerial image and hence also to measure a reference aerial image.

Should regions or partial areas with an identical arrangement of pattern elements not repeat on the mask 470, or only repeat at very long intervals, the above-described method (the so-called die-to-die method) for determining associated reference data 345 in the form of a reference aerial image cannot be used or can only be used with great outlay, i.e., after a relatively long search for a suitable reference. A method that can be used to generate a reference aerial image in such cases (but also independently thereof) is the so-called die-to-database method, in which corresponding second data 265 used for training purposes, which are linked to the second measuring apparatus 400, and/or associated reference data 345 in the form of a reference aerial image are obtained by means of an optical imaging simulation (rendering) from design data 490, for example from layout data. Ideal associated reference data 345 in the form of a reference aerial image of a mask 470 are calculated with the aid of an ab initio or rigorous simulation.

An ab initio simulation takes account of the optical interaction (scattering, diffraction, absorption, reflection) of the illumination radiation of the measuring apparatus 450, i.e., of the electromagnetic waves incident on the photomask 470, with the structures or pattern elements of the photomask 470, and the subsequent propagation of the transmitted and/or the reflected electromagnetic fields upstream or downstream of the mask 470 into the plane of the detector of the measuring device 450 in numerically rigorous fashion on the basis of Maxwell's equations. This means that Maxwell's equations are solved in three dimensions for the respective boundary conditions by way of suitable numerical methods. This represents a particular challenge, in particular for masks 470 whose structures or patterns appear three-dimensional to the illumination radiation on account of the different materials of the photomask 470.

A simplified model which assumes the masked structures to be two-dimensional and the diffracted waves to be freely propagating is referred to as "Kirchhoff's model" or "scalar imaging model." A simulation of corresponding second data 265 that are linked to the second measuring apparatus 400 and reference data 345 in the form of a reference aerial image used for training purposes and associated with the measurement data 335 on the basis of Kirchhoff's model can be simulated orders of magnitude faster, although it may not sufficiently accurately image all defects of the mask 470.

Figure 5:
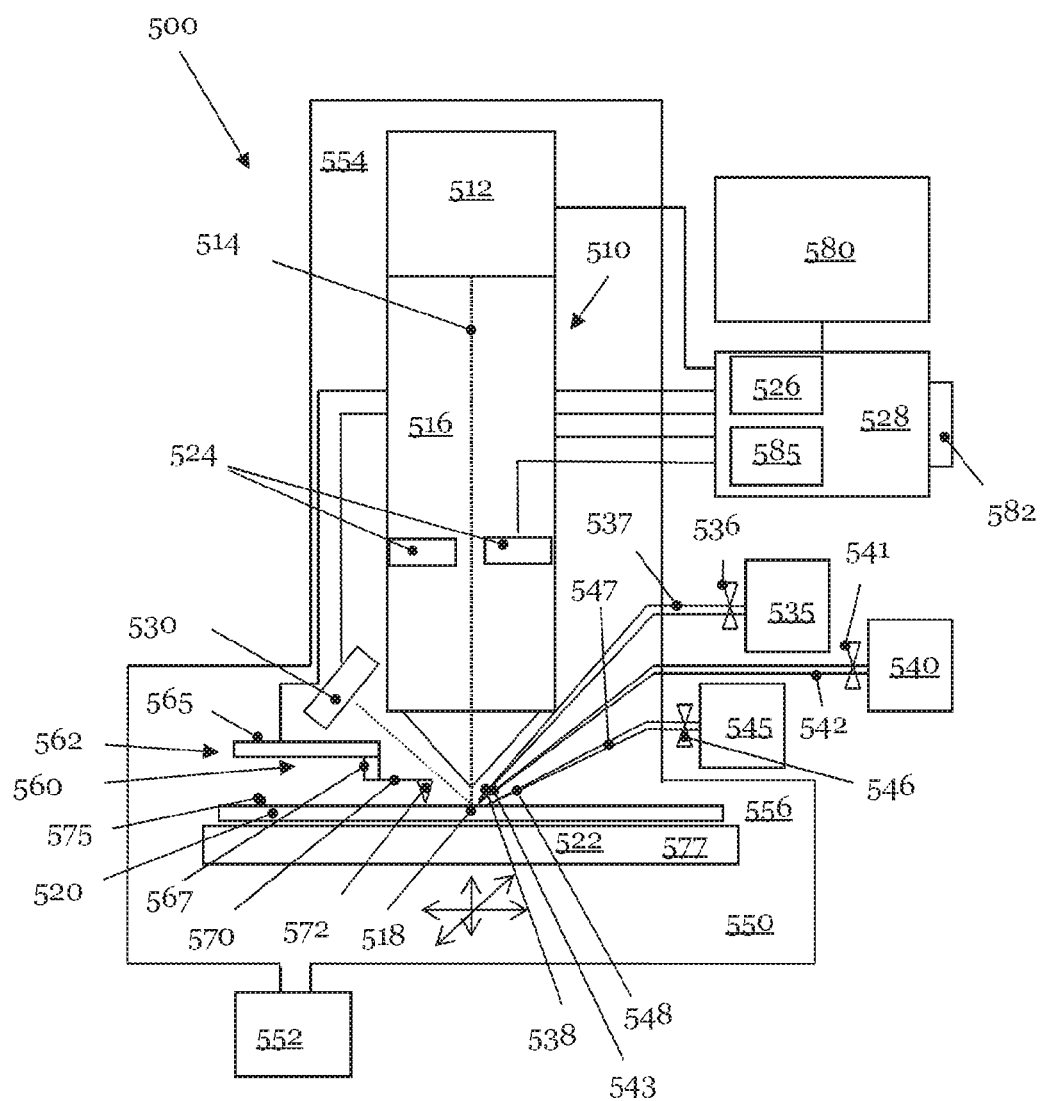
FIG. 5 schematically represents a section through an apparatus according to the invention.

FIG. 5 shows a schematic section through some important components of an apparatus 500. The apparatus 500 may comprise the above-described first measuring apparatus 500 for recording first data 230 and/or for recording first data 235 used for training purposes. Further, the apparatus 500 may contain the measuring apparatus 500 for recording measurement data 330 of a region of an element of a photolithography process, for example the photomask 470. Moreover, the measuring apparatus 500 can be used to record measurement data 335 used for training purposes. The measurement data 235, 335 can be used as input data for the trained transformation model 200 and/or for the trained model 300. Further, the measurement data 235, 335 used for training purposes can be used as input data for the learning transformation model 205 and/or for the learning model 305.

The exemplary apparatus 500 illustrated in FIG. 5 comprises a scanning particle microscope 510, which is embodied as a modified scanning electron microscope (SEM) 510 in FIG. 5. An electron gun 512 produces an electron beam 514, which is directed as a focused electron beam onto the location 518 on the sample 520 that may comprise the mask 470 by the imaging elements, not illustrated in FIG. 5, arranged in the column 516. The sample 520 is arranged on a sample stage 522 (or stage). Further, the imaging elements of the column 516 of the SEM 510 can scan the electron beam 514 over the sample 520. Consequently, first data 230 and/or first data 235 used for training purposes can be recorded or measured using the electron beam 514 of the SEM 510 of the first measuring apparatus 500. Further, the electron beam 514 of the SEM 510 of the measuring apparatus 500 can find use for recording measurement data 330 and/or measurement data 335 used for training purposes.

The electrons backscattered from the electron beam 514 by the sample 520 and the secondary electrons produced by the electron beam 514 in the sample 520 are registered by the detector 524. A detector 524 that is arranged in the electron column 516 is referred to as an "in lens detector." The detector 516 can be installed in the column 516 in various embodiments. The detector 524 is controlled by the control device 526 of the apparatus 500.

The control device 526 and/or the computer system 528 can scan the electron beam 514 over the sample 520 or the mask 470 in order to analyze the photomask 470 and/or check a region of the photomask 470, for example a repaired region of the photolithographic mask 470. Furthermore, the control device 526 of the SEM 510 receives the measurement data of the detector 524. The control device 526 can generate images from the measurement data, said images being represented on a monitor 580. Further, the control device 526 of the apparatus 500 can modify the exposure of the sample 520 by the electron beam 514. Thus, for example, the focal spot of the electron beam 514 can be modified along the beam direction. Moreover, the control device 526 or the computer system 528 can modify the angle of incidence of the electron beam 514 on the sample 520. For this purpose, the sample stage 522 can be tilted about the axis of the electron beam 514 (not shown in FIG. 5)—in addition to the movement options in the sample plane.

A trained transformation model 200 can generate not only an aerial image that looks as if it was measured by an AIMS™ but also an aerial image focus stack from a comprehensive data record of first data.

As an alternative or in addition thereto, the SEM 510 may have a detector 530 for backscattered electrons or for secondary electrons, said detector being arranged outside of the electron column 516. The detector 530 is likewise controlled by the control device 526.

In addition to analyzing and checking the sample 520, the electron beam 514 of the SEM 510 also can be used to modify at least one or more pattern elements of the pattern of the mask 470. To this end, the control device 526 or the computer system 528 may comprise one or more algorithms, which prompt the scanning electron microscope 510 to repair one or more pattern elements of the photomask 470. The exemplary scanning electron microscope 510 of FIG. 5 has three different supply containers 535, 540 and 545 for the purposes of repairing pattern elements of the mask 470.

The first supply container 535 stores a first precursor gas, for example a metal carbonyl, for instance chromium hexacarbonyl ($Cr(CO)_6$), or metal alkoxide, such as TEOS (tetraethyl orthosilicate), for instance. With the aid of the precursor gas stored in the first supply container 535, missing material of a pattern element can be deposited on the photomask 470 in a local chemical reaction, with the electron beam 514 of the SEM 510 acting as an energy supplier in order to split the precursor gas stored in the first supply container 535 at the location at which material should be deposited on the mask 470. This means that the combined provision of an electron beam 514 and a precursor gas leads to an EBID (electron beam induced deposition) process being carried out for local deposition of absorbing material on the mask 470.

An electron beam 514 can be focused onto a spot diameter of a few nanometers. As a result, an EBID process allows the local deposition of absorbing material with a spatial resolution in the low two-digit nanometer range.

In the apparatus 500 shown in FIG. 5, the second supply container 540 stores an etching gas, which makes it possible to perform a local electron beam induced etching (EBIE) process. Excess absorbing material of one or more pattern elements can be removed from the photomask 470 with the aid of an electron beam induced etching process. An etching gas can comprise xenon difluoride ($XeF_2$), chlorine ($Cl_2$), oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide (NO$_2$), nitric acid (HNO$_3$), ammonia (NH3) or sulfur hexafluoride (SF$_6$), for example.

An additive gas can be stored in the third supply container 545, said additive gas, where necessary, being able to be added to the etching gas kept available in the second supply container 540 or to the precursor gas stored in the first supply container 535. Alternatively, the third supply container 545 can store a second precursor gas or a second etching gas.

In the scanning electron microscope 510 illustrated in FIG. 5, each of the supply containers 535, 540 and 545 has its own control valve 536, 541 and 546 in order to monitor or control the amount of the corresponding gas that is provided per unit time, i.e., the gas volumetric flow at the location 518 of the incidence of the electron beam 514 on the sample 520. The control valves 536, 541 and 546 are controlled and monitored by the control device 526. Using this, it is possible to set the partial pressure conditions of the gases provided at the processing location 518 for changing one or more pattern elements in a broad range.

Furthermore, in the exemplary SEM 510 in FIG. 5, each supply container 535, 540 and 545 has its own gas feedline system 537, 542 and 547, which ends with a nozzle 538, 543 and 548 in the vicinity of the point of incidence 518 of the electron beam 514 on the sample 520.

The supply containers 535, 540 and 545 can have their own temperature setting element and/or control element, which allows both cooling and heating of the corresponding supply containers 535, 540 and 545. This makes it possible to store and in particular provide the precursor gas and/or the etching gas(es) at the respectively optimum temperature (not shown in FIG. 5). The control device 526 can control the temperature setting elements and the temperature control elements of the supply containers 535, 540, 545. When processing the sample 520 or the mask 470 by use of EBID and/or EBIE processes, the temperature setting elements of the supply containers 535, 540 and 545 can further be used to set the vapor pressure of the precursor gases stored therein by way of the selection of an appropriate temperature.

The scanning electron microscope 510 illustrated in FIG. 5 can be operated under ambient conditions or in a vacuum chamber 550. Modifying a pattern element of the mask 470 necessitates a reduced pressure in the vacuum chamber 550 relative to the ambient pressure. For this purpose, the SEM 510 in FIG. 5 comprises a pump system 552 for generating and for maintaining a reduced pressure required in the vacuum chamber 550. With closed control valves 536, 541 and 546, a residual gas pressure of $<10^{-4}$ Pa is achieved in the vacuum chamber 550. The pump system 552 can comprise separate pump systems for the upper part 554 of the vacuum chamber 550 for providing the electron beam 514 of the SEM 510 and for the lower part 556 or the reaction chamber 556 (not shown in FIG. 5).

Additionally, the exemplary apparatus 500 illustrated in FIG. 5 comprises a scanning probe microscope 560 which, in the apparatus 500, is embodied in the form of a scanning force microscope 560 or an atomic force microscope (AFM) 560. The scanning probe microscope 560 is an optional component of the apparatus 500. Using the scanning probe microscope 560, it is possible to analyze or check the contour of the photomask 470, in particular the defects thereof or the repaired defects thereof. Moreover, it is possible to use the AFM 560 for removing excess material of one or more pattern elements of the photomask 470.

The measuring head 562 of the scanning probe microscope 560 is illustrated in the apparatus 500 of FIG. 5. The measuring head 562 comprises a holding apparatus 565. The measuring head 562 is fastened to the frame of the apparatus 500 by use of the holding apparatus 565 (not shown in FIG. 5). A piezo-actuator 567 which facilitates a movement of the free end of the piezo-actuator 567 in three spatial directions (not illustrated in FIG. 5) is attached to the holding apparatus 565 of the measuring head 562. A bending bar 570 or a cantilever 570 is fastened to the free end of the piezo-actuator 567. The cantilever 570 has a holding plate for attachment to the piezo-actuator 567. The free end of the cantilever 570 has a measuring tip 572, by means of which the sample 520 is probed.

In the apparatus 500 of FIG. 5, a sample 520 to be examined, for example, the photomask 470, is fastened to a sample stage 522. The sample surface 575 of the sample 520 to be examined points away from the sample stage 522. By way of example, the sample 520 can be fixed by placing the sample 520 on the bearing points of the sample stage 522 in a vacuum or high vacuum environment or by an electrostatic interaction between the sample stage 522 and an electrically conductive rear side of the sample 520. Moreover, the sample 520 can be held on the sample stage 522 by clamping (not shown in FIG. 5).

As symbolized by arrows in FIG. 5, the sample stage 522 can be moved by a positioning system 577 in three spatial directions relative to the measuring head 562 of the AFM 560 and/or the point of incidence 518 of an electron beam 514. In the example in FIG. 5, the positioning system 577 is embodied in the form of a plurality of micromanipulators or displacement elements. The movement of the sample stage 522 in the sample plane, i.e., in the xy-plane, which is perpendicular to the beam direction of the electron beam 514, can be controlled by two interferometers (not shown in FIG. 5). In an alternative embodiment, the positioning system 577 may additionally contain piezo-actuators (not illustrated in FIG. 5). The positioning system 577 is controlled by signals of the control device 526. In an alternative embodiment, the control device 526 does not move the sample stage 522, but rather the holding apparatus 565 of the measuring head 562 of the AFM 560. It is furthermore possible for the control device 526 to perform a coarse positioning of the sample 520 in height (z-direction) and for the piezo-actuator 567 of the measuring head 562 to perform a precise height setting of the AFM 560. The control device 526 can be part of a computer system 528 of the apparatus 500.

The control device 526 or the computer system 528 can have one or more algorithms that act on the apparatus 500 in order to analyze a sample 520, for example the photomask 470 by use of the measuring tip 572 of the AFM, or to check a region, for instance a repaired region of the mask 470.

The AFM 560 can be used to produce first data 230 or first data 235 used for training purposes of the first measuring apparatus 500. Further, the AFM 560 can be used to generate measurement data 330 or measurement data 335 used for training purposes for at least one region of the photomask 470. Moreover, it is possible to produce first data 230 or first data 235 used for training purposes by combining data measured by the electron beam 514 of the SEM 510 and data measured by the measuring head 562 of the AFM 560. Moreover, the measurement data 330 of a region of the photomask 470 and/or the measurement data 335 used for training purposes can likewise be synthesized by combining data measured by the SEM 510 and the AFM 560. It is possible to produce a realistic three-dimensional image of a sample 520 by combining the measurement data of the measuring instruments 510 and 560.

The computer system 528 of the first measuring apparatus 500 or the measuring apparatus 500 contains an interface 582, by means of which the apparatus 500 can interchange data with the second measuring apparatus 400. Further, the computer system 528 of the first measuring apparatus 500 or the measuring apparatus 500 has a memory 585. A trained transformation model 200 and/or a trained model for transformation purposes 300 can be stored in the memory 585. The computer system 528 of the first measuring apparatus 500 can apply the trained transformation model 200 in order to transform the first data 230, which were measured by the electron beam 514 of the SEM 510, for example, into second, non-measured data 250. In the example illustrated in FIG. 5, the second data 250 contain an aerial image of a region or a portion of the photomask 470.

Reference data 340 associated with measurement data 330 can be stored in the memory 585 of the computer system 528 of the measuring apparatus 500. The computer system 528 can receive the associated reference data 340 via the interface 582. Further, a trained model for transformation purposes 300 can be stored in the memory 585 of the computer system 528. Hence, the computer system 528 of the measuring apparatus 500 is put into the position of using the trained model for transformation purposes 300 in order to predict a quality measure 350 of a region of the photomask 470 from the measurement data 330, which were measured by the SEM 510, for example, and the stored associated reference data 340, or to transform the input data, i.e., the measurement data 330 and the reference data 340, into a quality measure 350.

Corresponding second data 265 linked with the second measuring apparatus 400 can be stored in the memory 585 of the computer system 528 of the first measuring apparatus 500 as a part of a training data record for the transformation model 200. As a result, the computer system 528 of the first measuring apparatus 500 satisfies all preconditions for training the transformation model 200 for its output, i.e., the transformation of the first data 230 into transformed second, non-measured data 250. This means the computer system 528 can train the transformation model 200 with the aid of the training data record saved in the memory 585. To this end, it is expedient if—as already explained above—the computer system 528 comprises one or more capable graphics processors and/or other specialist hardware (not illustrated in FIG. 5).

Moreover, in addition to the measurement data 330 and the associated reference data 340, corresponding quality measures 365 may also be stored in the memory 585 of the computer system 528 of the measuring apparatus 500. Consequently, the computer system 528 of the measuring apparatus 500 can train the model 300 on the basis of the measurement data 335 used for training purposes and the associated reference data 345 as input data and the stored corresponding quality measures 365 as comparison data for the quality measures 335 predicted by the model 305 in training.

The apparatus 500 of FIG. 5 can be considered to be the first measuring apparatus 500 for recording first data 230 or first data 235 used for training purposes. However, it is also possible to interpret the SEM 510 and/or the AFM 560 of the apparatus 500 as the first measuring apparatus 500. Further, the apparatus 500 can be considered to be a measuring apparatus for recording measurement data of a region of the photomask 470. However, it is also possible to consider the SEM 510 and/or the AFM 560 of the apparatus 500 to be the measuring apparatus for recording measurement data of a region of the photomask 470.

The training data records for the transformation model 205 in training preferably comprise, e.g., $10^3$ to $10^8$ data pairs. The training data records for the model 305 in training likewise preferably contain, e.g., $10^3$ to $10^8$ data triples.

Figure 6:
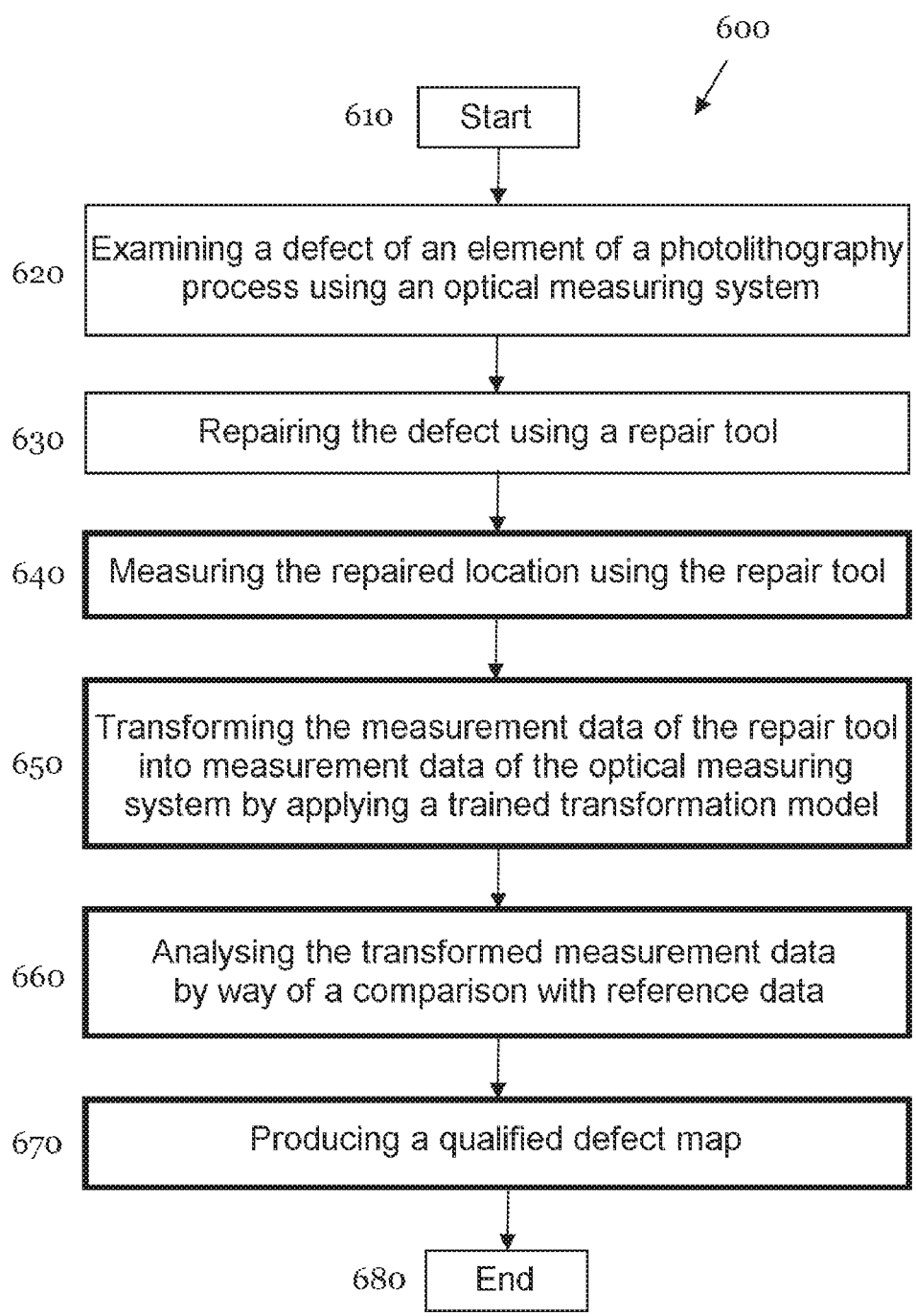
FIG. 6 schematically presents the changes in the workflow of a first embodiment of the invention described in this application in relation to the workflow explained in FIG. 1.

The flowchart 600 of FIG. 6 schematically shows the workflow for repairing defects of a photomask 470 according to a first exemplary embodiment of the invention described in this application. The modifications in relation to the currently conventional workflow are highlighted in FIG. 6 by a thicker edging of the method steps. The workflow starts at block 610. A defect of the photomask 470 or, more generally, of an element 470 of a photolithography process is examined in step 620 using the optical measuring system 400, said defect having been previously found or identified by an inspection system.

In the next step 630, the defect of the photolithographic mask 470 or, more generally, the defect of an element 470 of a photolithography process is repaired using a repair tool. To this end, use can be made of the apparatus 500, in particular the modified SEM 510.

The repaired defect or the repaired location of the photomask 470 is measured by the repair tool 500 in step 640. In contrast to the workflow explained in FIG. 1, the repaired location of the mask 470 is measured not with the optical measuring system 400 but with the electron beam 514 of the SEM 510 of the repair tool 500, 510. In addition to the electron beam 514 of the SEM 510, the measuring tip 572 of the AFM 560 can additionally or alternatively be used for checking the repaired location of the mask 470. This means that the repair tool 500, 510 records the first data 230.

Thereupon, first data 230, i.e., for example, the measurement data 230 of the SEM 510 of the repair tool 500, are transformed using the trained transformation model 200 in step 650 into second, non-measured data 250, i.e., into measurement data 250 that correspond to a measurement of the photomask 470 using the second measuring apparatus 400 or the optical measuring system 400, an aerial image 420, for example.

In step 660, the transformed first data 250 are analyzed by comparison with reference data, for example with a reference aerial image generated by the second measurement apparatus 400. In the next step 670, a qualified defect map is produced for the photomask 470 on the basis of the transformed first data 250 and the reference data. The qualified defect map comprises information items about the effects of the defects specified in a defect map when, during an exposure process, the photomask 470 images a photoresist applied to a wafer. Finally, the method ends in step 680.

Figure 7:
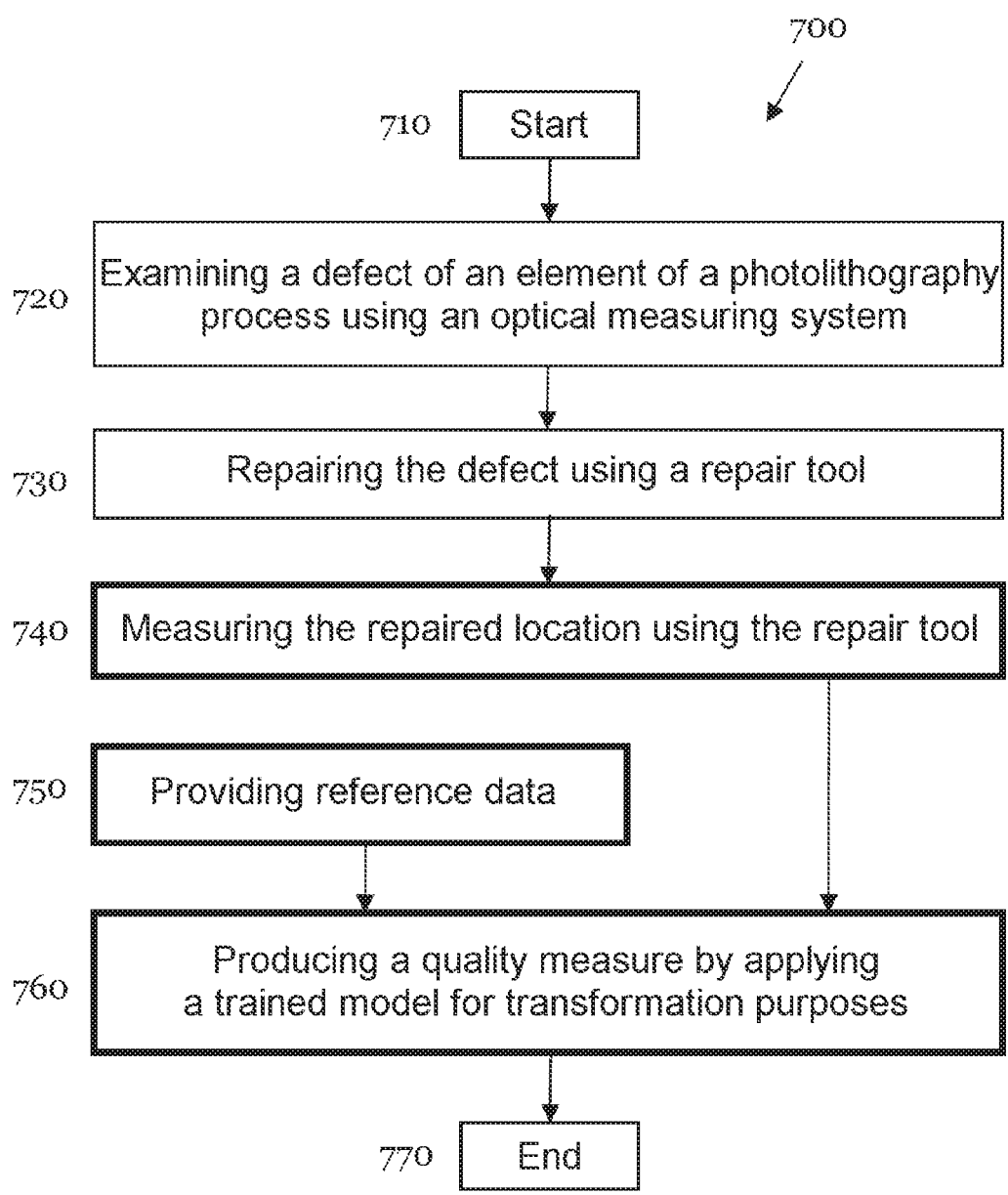
FIG. 7 schematically reproduces the changes in the workflow of a second embodiment of the invention described in this application in relation to the workflow described in FIG. 1.

The flowchart 700 of FIG. 7 schematically presents the workflow of a repair of defects of a photomask 470 according to a second exemplary embodiment of the invention described in this application. The modifications in relation to the current repair workflow are highlighted in turn in FIG. 7 by a thicker edging of the method steps. The workflow of the repair process starts at block 710. Similar to in FIGS. 1 and 6, a defect of the photomask 470 or, more generally, of an element 470 of a photolithography process is examined in step 720 using the optical measuring system 400, said defect having been previously found or identified by an optical inspection system.

In the next step 730, the defect of the photolithographic mask 470 or, more generally, the defect of an element 470 of a photolithography process is repaired using a repair tool 500, 510.

The repaired defect or the repaired location of the photomask 470 is measured by the repair tool 500, 510 in step 740. In contrast to the workflow explained in FIG. 1, the repaired location of the mask 470 is measured not with the optical measuring system 400 but with the electron beam 514 of the SEM 510 of the repair tool 500. Alternatively, it is also possible to scan the repaired location of the mask 470 using an ion beam. Moreover, it is also conceivable to scan the repaired location using a scanning probe microscope, for instance the AFM 560 of FIG. 5, in order to determine the success of the defect repair. Finally, it is also possible to scan the repaired location of the photomask 470 both with a charged particle beam, for instance the electron beam 514 of the SEM 510, and a scanning probe microscope, for example the AFM 560 of the apparatus 500. The repair tool 500, 510 produces the measurement data 330.

In step 750, reference data 340 are provided, said reference data corresponding to or being associated with the measurement data 330 of the region of the photomask 470 examined with the SEM 510.

Thereupon, a quality measure 350 for the photolithographic mask 470 is produced in step 760 on the basis of the measurement data 330 and the associated reference data 340 as input data by applying the trained model for transformation purposes 300. Finally, the method ends in step 770.

Both the embodiment of FIG. 6 and the embodiment of FIG. 7 avoid a second use of the optical measuring apparatus 400.

Figure 8:
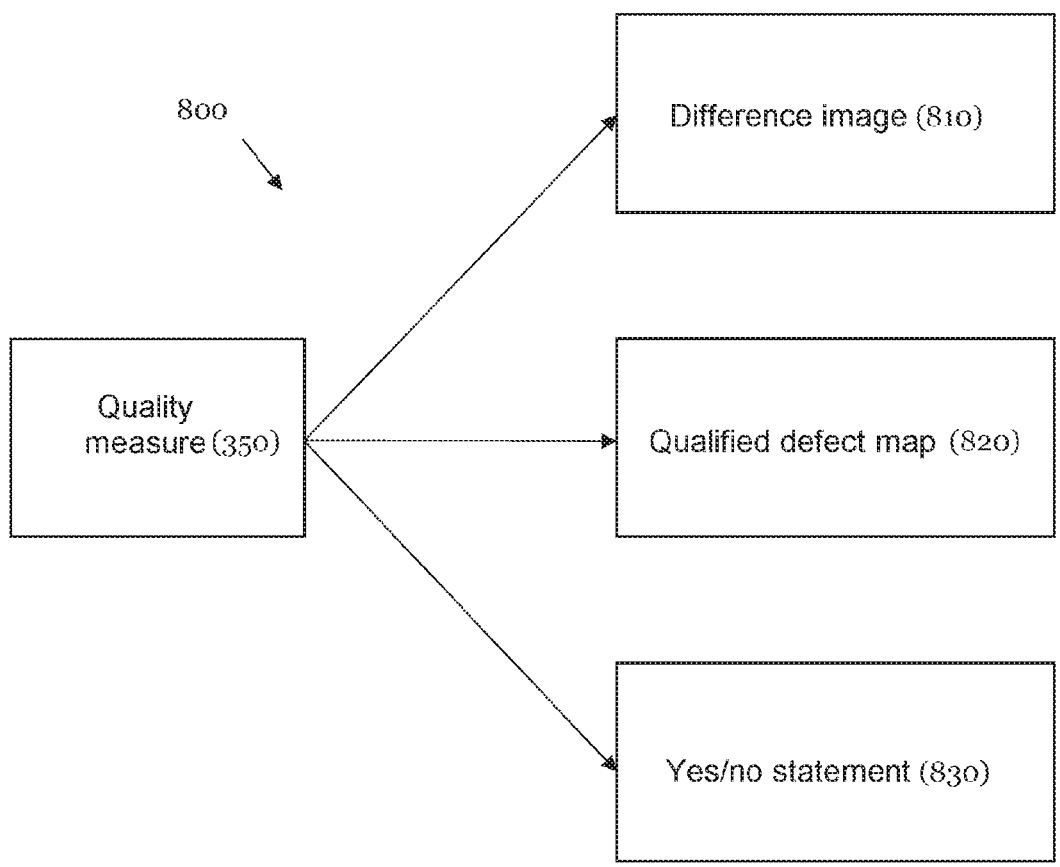
FIG. 8 schematically elucidates various manifestations of a quality measure.

The diagram 800 of FIG. 8 schematically shows three different exemplary embodiments or manifestations of the quality measure 350. In a first exemplary embodiment, the quality measure 350 comprises a difference image 810 between an image of the measurement data 330 of the photomask 470 and an image of the reference data 340 of the photomask 470. The difference image 810 has differences between the image of the measurement data 330 and the image of the reference data 340. The effects of the deviations or of the defects of the photomask 470 on the operational behavior thereof during the exposure of a wafer can be ascertained on the basis of the difference image 810. The difference image comprises an image with the same or a similar number of pixels as the measurement data 330, which are provided as input data to the trained model for transforming 300 the measurement data 330.

The quality measure 350 comprises a qualified defect map 820 in a second manifestation. Unlike the difference image 810, the quality measure 350 in the form of a qualified defect map 820 contains information items about the effects of the defects specified in a defect map, said defects occurring when carrying out a photolithography process with the photomask 470. What should be done going forward with the considered photomask 470 can be ascertained on the basis of the qualified defect map 820, depending on one or more predetermined thresholds. Typically, the qualified defect map 820 comprises a two-dimensional image with a number of pixels, which corresponds or is very similar to the image of the measurement data 330 or the input image.

However, it is also possible to embody a qualified defect map in the form of a list, which captures the identified defects of a region of a photomask 470 or of the entire photomask 470 in the form of a table. Here, the qualified defect map 820 may comprise, for example, the position of a centroid of a defect, its position in relation to adjacent pattern elements, the defect type, the defect size and the effect(s) of the defect, for example in relation to the parameter settings of a scanner, which exposes the photomask 470. The effects of the defect can be assessed in categorized form.

The quality measure 350 has the form of a yes/no statement 830 in a third exemplary embodiment. The yes/no statement 830 may comprise the statement as to whether or not a region of the photomask 470 or the entire photomask 470 can be used in a photolithography process. In this exemplary embodiment, the trained model 300 supplies a digital statement in respect of the further use of the photomask 470 on the basis of the measurement data 330 and the reference data. If the quality measure 350 is present in the form of a yes/no statement 830, the model 300 is fitted to the quality measure 350 and it has a classifier at its output.

Figure 9:
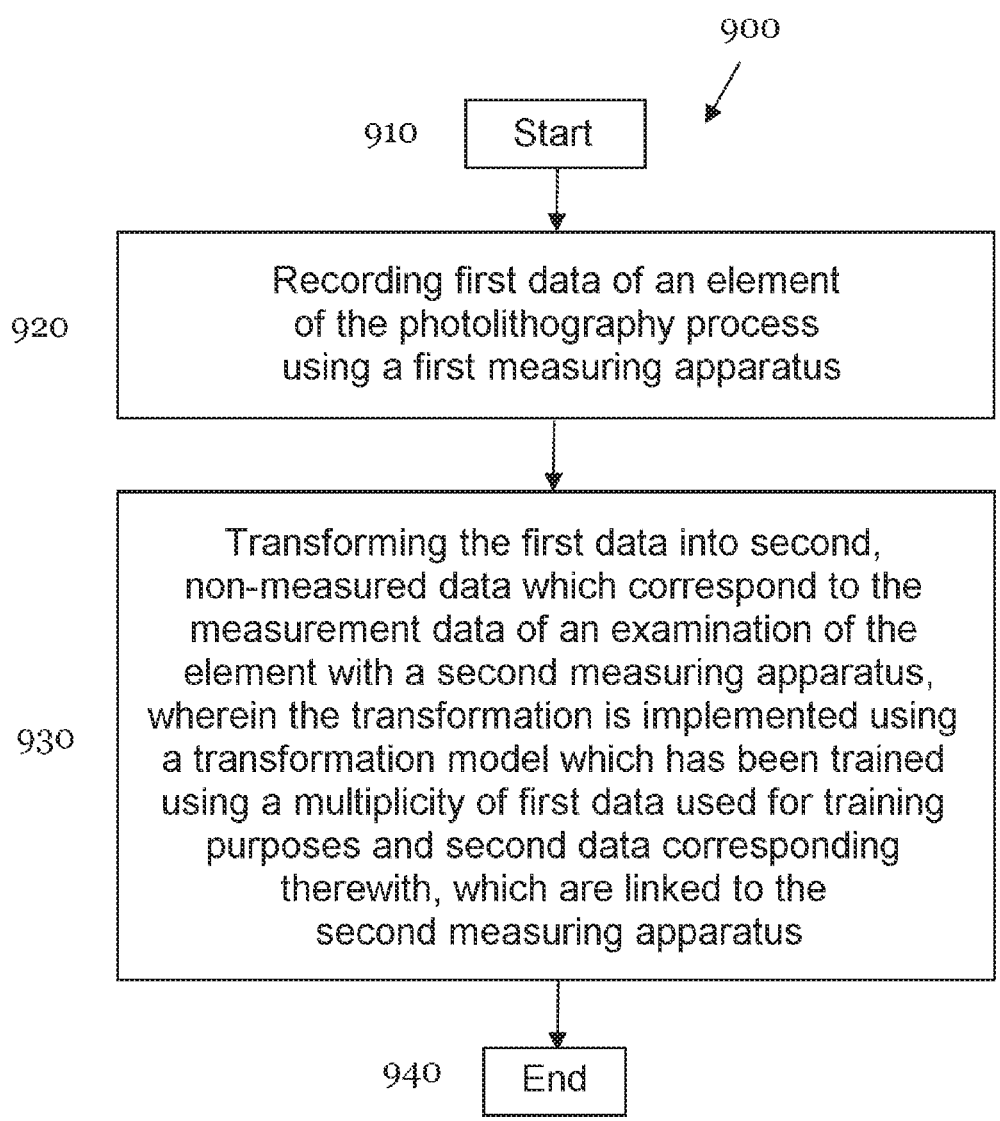
FIG. 9 shows a flowchart of a first method for analyzing an element of a photolithography process by producing second, non-measured data, which correspond to measurement data of a measurement of the element by a second measuring apparatus, from first data, which were measured by a first measuring apparatus, with the aid of a trained transformation model.

The flowchart 900 of FIG. 9 elucidates a first exemplary embodiment of the method according to the invention described in this application. The method begins in step 910. First data 230 of an element 470 of a photolithography process are recorded by a first measuring apparatus 500, 510, 560 in a first step 920.

In a second step 930, the first data 230 are transformed into second, non-measured data 250, which correspond to measurement data 420 of an examination of the element 470 with a second measuring apparatus 400, wherein the transforming is implemented with a transformation model 200, which has been trained using a multiplicity of first data 235 used for training purposes and second data 265 corresponding therewith, which are linked to the second measuring apparatus 400. The method finally ends at step 940.

The flowchart 1000 of FIG. 10 reproduces a second exemplary embodiment of the method according to the invention described in this application. The method begins in step 1010. Measurement data 330 of a region of an element 470 of a photolithography process are recorded by a measuring apparatus 500, 510, 560 in a first step 1020.

In a second step 1030, a model 300 is used for transforming the measurement data 330 and reference data 340 associated with the measurement data 330 into a quality measure 350 of the element 470, wherein the quality measure contains an information item about effects of the region of the element 470 when carrying out a photolithography process. The model 300 has been trained using a multiplicity of measurement data 335 used for training purposes, reference data 345 associated with the measurement data 335 and corresponding quality measures 365. Finally, the method ends in step 1040.

In some implementations, the computer systems 410 (FIG. 4) and 528 (FIG. 5) can include one or more capable graphics processors (GPU, graphical processing unit) or other objective-optimized computer hardware, for instance a tensor processing unit as discussed above. The computer systems 410 and 528 can also include one or more computer-readable media (e.g., ROM, DRAM, SRAM, SDRAM, hard disk, optical disk, and flash memory). The one or more processors or processing units can perform various computations described above. The computations can also be implemented using application-specific integrated circuits (ASICs). The term "computer-readable medium" refers to a medium that participates in providing instructions to a processor for execution, including without limitation, non-volatile media (e.g., optical or magnetic disks), and volatile media (e.g., memory) and transmission media. Transmission media includes, without limitation, coaxial cables, copper wire, fiber optics and free space. The memory can include any type of memory, such as ROM, DRAM, SRAM, SDRAM, and flash memory.

The features described above (e.g., steps 650-670, 760, 930, and 1030) can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., C, Java, Python), including compiled or interpreted languages, and it can be deployed in any form, including as a stand-alone program or as a module, component, subroutine, a browser-based web application, or other unit suitable for use in a computing environment.

Suitable processors for the execution of a program of instructions include, e.g., general purpose microprocessors, special purpose microprocessors, digital signal processors, single-core or multi-core processors, graphics processors, and/or tensor processing units, of any kind of computers. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM, DVD-ROM, and Blu-ray BD-ROM disks. The processor and the memory can be supplemented by, or incorporated in, ASICs (application-specific integrated circuits).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results. The transformation model is not limited to the models 205, 200, 305, 300 shown in FIGS. 2A to 3B. Other types of transformation models are also within the scope of the invention. The quality measure is not limited to those described above, such as a difference image, a qualified defect map, or a yes/no statement. Other types of quality measures are also within the scope of the invention. The training data and the processes for training the models are not limited to those described above.

What is claimed is:

1. An apparatus for analyzing a first photomask, the apparatus comprising:
   a. a scanning particle microscope for measuring first image data of the first photomask; and
   b. a computer system comprising a transformation model configured to transform the first image data into second image data that represents a prediction of an image of the first photomask measured by an optical measuring tool if the optical measuring tool were used to measure the first photomask, wherein the image represented by the first image data comprises at least 32×32 pixels, wherein the transformation model comprises at least one encoder block for determining information-carrying features from the first image data and at least one decoder block for producing the second image data, and wherein the transformation model enables an assessment of the first photomask without the first photomask needing to be transported and aligned with respect to the optical measuring tool;
   c. wherein the transformation model has been trained using a multiplicity of first training data and second training data,
      wherein the first training data comprise data obtained by using the scanning particle microscope to measure a set of at least one photomask, and the second training data comprise image data obtained by using the optical measuring tool to measure the set of at least one photomask,
      wherein the transformation model is trained by:
         applying the transformation model to the first training data to generate third image data that represents a prediction of at least one image of the set of at least one photomask measured by the optical measuring tool,
         comparing the third image data with corresponding fourth image data in the second training data, wherein the fourth image data represents the at least one image of the set of at least one photomask measured by the optical measuring tool, and
         modifying parameters of the transformation model based on the comparison of the third image data with the corresponding fourth image data.

2. An apparatus for transforming first image data of a first element of a photolithography process measured by use of a first measuring apparatus into second image data, the apparatus comprising:
   a computer system comprising a transformation model;
   wherein the second image data represents a prediction of an image of the first element measured by a second measuring apparatus if the second measuring apparatus were used to measure the first element, enabling an assessment of the first element without the first element needing to be transported and aligned with respect to the second measuring apparatus,
   wherein the second measuring apparatus comprises at least one of: a first scanning particle microscope or an optical measuring tool,
   wherein the transformation model has been trained using a multiplicity of first training data and second training data,
   wherein the first training data comprise data obtained by using the first measuring apparatus to measure a set of at least one element of the photolithography process, and the second training data comprise image data obtained by using the second measuring apparatus to measure the set of at least one element of the photolithography process, and wherein the apparatus is configured to use the transformation model to transform the first image data of the first element of the photolithography process into the second image data;

wherein the transformation model comprises at least one encoder block for determining information-carrying features from the first image data and at least one decoder block for producing the second image data; and wherein the transformation model is trained by:
    applying the transformation model to the first training data to generate third image data that represents a prediction of at least one image of the set of the at least one element of the photolithography process measured by use of the first measuring apparatus;
    comparing the third image data with corresponding fourth image data in the second training data, wherein the fourth image data represents the at least one image of the at least one element of the photolithography process measured by the second measuring apparatus; and
    modifying parameters of the transformation model based on the comparison of the third image data with the corresponding fourth image data.

3. The apparatus of claim 2, wherein the second training data that is associated with the second measuring apparatus comprise data measured by the second measuring apparatus and/or comprise corresponding simulation data instead of second training data measured by the second measuring apparatus.

4. The apparatus of claim 2, wherein the first measuring apparatus comprises at least one element from the group: a second scanning particle microscope, a scanning probe microscope, and an interferometer, and/or wherein the optical measuring tool comprises an AIMS™ tool, a WLCD tool and/or a PROVE® tool.

5. The apparatus of claim 2, wherein the first image data comprise:
    a. first measurement data of a region of the element of the photolithography process, which has at least one defect; and/or
    b. first measurement data of a repaired region of the element of the photolithography process.

6. The apparatus of claim 2, wherein the second image data comprise an image with a two-dimensional pixel representation.

7. The apparatus of claim 2, wherein the second image data comprise an aerial image and/or an aerial image focus stack.

8. The apparatus of claim 2, wherein the first image data comprise first measurement data that were recorded with different parameter settings of the first measuring apparatus.

9. The apparatus of claim 2, wherein at least one of the first or the second measuring apparatus comprises a scanning electron microscope, which is embodied to scan the element of the photolithography process and which is further embodied to repair a defect of the element of the photolithography process.

10. The apparatus of claim 2, wherein the transformation model comprises a machine learning model.

11. The apparatus of claim 2, wherein the first element of the photolithography process comprises at least a first photomask, a first template of nanoimprint lithography, a first mold of nanoimprint lithography, or a first wafer;

wherein the set of at least one element of the photolithography process comprises at least one of (i) a set of at least one photomask, (ii) a set of at least one template of nanoimprint lithography, (iii) a set of at least one mold of nanoimprint lithography, or (iv) a set of at least one wafer.

12. The apparatus of claim 2, wherein the first measuring apparatus comprises at least one of a scanning particle microscope, a scanning probe microscope, or an interferometer.

13. The apparatus of claim 2 wherein the image represented by the first image data comprises at least 32×32 pixels.

14. The apparatus of claim 2 wherein the image represented by the first image data comprises at least 224×224 pixels.

15. A method for analyzing a first element of a photolithography process, including the steps of:
    a. measuring first image data of the first element with a first measuring apparatus; and
    b. transforming the first image data into second image data that represents a prediction of an image of the first element measured by a second measuring apparatus if the second measuring apparatus were used to measure the first element, enabling an assessment of the first element without the first element needing to be transported and aligned with respect to the second measuring apparatus, wherein the second measuring apparatus comprises at least one of: a scanning particle microscope or an optical measuring tool, wherein the transforming of the first image data into the second image data is performed using an apparatus that comprises a computer system comprising a transformation model, wherein the transformation model comprises at least one encoder block for determining information-carrying features from the first image data and at least one decoder block for producing the second image data, wherein the transformation model has been trained using a multiplicity of first training data and second training data, wherein the first training data comprise image data obtained by using the first measuring apparatus to measure a set of at least one element of the photolithography process, and the second training data comprise image data obtained by using the second measuring apparatus to measure the set of at least one element of the photolithography process, and wherein the transformation model is trained by:
    applying the transformation model to the first training data to generate third image data that represents a prediction of at least one image of the set of the at least one element of the photolithography process measured by use of the first measuring apparatus,
    comparing the third image data with corresponding fourth image data of the second training data, wherein the fourth image data represents the at least one image of the set of at least one element of the photolithography process measured by the second measuring apparatus, and
    modifying parameters of the transformation model based on the comparison of the third image data with the corresponding fourth image data.

16. The method of claim 15, wherein transforming the first image data comprises: transforming the first measured data, which were recorded with different parameter settings of the first measuring apparatus, into an aerial image focus stack.

17. The method of claim 15, wherein the first element of the photolithography process comprises at least a first photomask, a first template of nanoimprint lithography, a first mold of nanoimprint lithography, or a first wafer, and
wherein the set of at least one element of the photolithography process comprises at least one of (i) a set of at least one photomask, (ii) a set of at least one template of nanoimprint lithography, (iii) a set of at least one mold of nanoimprint lithography, or (iv) a set of at least one wafer.

18. The method of claim 15, wherein the first measuring apparatus comprises at least one of a scanning particle microscope, a scanning probe microscope, or an interferometer.

19. An apparatus comprising:
at least one of: a scanning particle microscope or a scanning probe microscope configured to generate first measurement data representing measurements of a first element of a photolithography process; and
a computer system comprising a transformation model configured to transform the first measurement data into second image data,
wherein the transformation model comprises at least one encoder block for determining information-carrying features from the first measurement data and at least one decoder block for producing the second image data,
wherein the second image data represents a prediction of an image of the first element measured by an optical measuring tool if the optical measuring tool were used to measure the first element, enabling an assessment of the first element without the first element needing to be transported and aligned with respect to the optical measuring tool; and
wherein the transformation model has been trained using a multiplicity of previously recorded first training data and second training data, the first training data comprise data obtained by using at least one of: the scanning particle microscope or the scanning probe microscope to measure a set of at least one element of the photolithography process, and the previously recorded second training data comprise data obtained by using the optical measuring tool to measure the set of at least one element of the photolithography process;
wherein the transformation model is trained by:
applying the transformation model to the first training data to generate third image data that represents a prediction of at least one image of the set of the at least one element of the photolithography process measured by use of the scanning particle microscope or the scanning probe microscope,
comparing the third image data with corresponding fourth image data of the second training data, wherein the fourth image data represents the at least one image of the set of at least one element of the photolithography process measured by the optical measuring tool, and
modifying parameters of the transformation model based on the comparison of the third image data with the corresponding fourth image data.

20. The apparatus of claim 19, comprising a photolithography processing tool, in which the at least one of a scanning particle microscope or a scanning probe microscope is part of the photolithography processing tool;
wherein the scanning particle microscope is configured to generate a particle beam;
wherein the scanning probe microscope comprises a probe;
wherein the photolithography processing tool is configured to use the particle beam of the scanning particle microscope or the probe of the scanning probe microscope to process at least one of a mask, a template, or a wafer; and
wherein the photolithography processing tool is further configured to use the particle beam or the probe to generate the first measurement data.

21. The apparatus of claim 20 in which the optical measuring tool is configured to generate an aerial image of a region on the mask, the template, or the wafer, and the second image data represents a simulated aerial image of the region on the mask, the template, or the wafer.

22. The apparatus of claim 19, wherein the first element of the photolithography process comprises at least a first photomask, a first template of nanoimprint lithography, a first mold of nanoimprint lithography, or a first wafer;
wherein the set of at least one element of the photolithography process comprises at least one of (i) a set of at least one photomask, (ii) a set of at least one template of nanoimprint lithography, (iii) a set of at least one mold of nanoimprint lithography, or (vi) a set of at least one wafer.

\* \* \* \* \*

UNITED STATES PATENT AND TRADEMARK OFFICE
CERTIFICATE OF CORRECTION

| | | |
|---|---|---|
| PATENT NO. | : 12,001,145 B2 | Page 1 of 1 |
| APPLICATION NO. | : 16/415510 | |
| DATED | : June 4, 2024 | |
| INVENTOR(S) | : Alexander Freytag et al. | |

It is certified that error appears in the above-identified patent and that said Letters Patent is hereby corrected as shown below:

On the Title Page

<u>Page 2</u>
Column 2 (Other Publications), Line 19, delete "DefenseNets" and insert -- DenseNets --

In the Specification

<u>Column 1</u>
Line 21, delete "photo-lithography" and insert -- photolithography --

<u>Column 6</u>
Line 39, after "element" insert -- . --

<u>Column 11</u>
Line 31, delete "Segmention"" and insert -- Segmentation" --

In the Claims

<u>Column 32</u>
Line 45, in Claim 22, delete "(vi)" and insert -- (iv) --

Signed and Sealed this
First Day of October, 2024

Katherine Kelly Vidal
*Director of the United States Patent and Trademark Office*